United States Patent [19]

Dent et al.

[11] Patent Number: 5,005,150

[45] Date of Patent: Apr. 2, 1991

[54] DIGITAL SIGNAL PROCESSORS

[75] Inventors: Peter R. Dent, Bedford; Rajpal S. Bharya, Brickhill, both of United Kingdom

[73] Assignee: Texas Instruments Incorporated, Dallas, Tex.

[21] Appl. No.: 336,956

[22] Filed: Apr. 12, 1989

[30] Foreign Application Priority Data

Apr. 12, 1988 [GB] United Kingdom ............... 8808569

[51] Int. Cl.⁵ ............................................. G06F 7/38
[52] U.S. Cl. .................................... 364/736; 364/757
[58] Field of Search .............. 364/736, 750.5, 754–760

[56] References Cited

U.S. PATENT DOCUMENTS

| | | | |
|---|---|---|---|
| 4,153,938 | 5/1979 | Ghest et al. | 364/757 |
| 4,644,488 | 2/1987 | Nathan | 364/757 |
| 4,722,068 | 1/1988 | Kuroda et al. | 364/757 |
| 4,811,269 | 3/1989 | Hirose et al. | 364/754 |
| 4,823,258 | 4/1989 | Yamazaki | 364/736 |
| 4,823,300 | 4/1989 | Malinowski | 364/757 |

Primary Examiner—Dale M. Shaw
Attorney, Agent, or Firm—William E. Hiller; N. Rhys Merrett; Melvin Sharp

[57] ABSTRACT

A digital signal processor includes a parallel multiplier having first and second input ports, in which the first input port has conductors for many more bits than does the second input port. First and second data selectors are connected respectively to the first and second ports to enable data from a RAM and data from a ROM to be selectively applied to either or both ports, directly or via a pipe-line register. The second data selector can select two or more groups of bits from the RAM or ROM to enable the multiplier to multiply numbers having more bits than can be input at the second input port at one time. A third data selector is connected to the output port of the multiplier and is capable of shifting the product received relative to the output conductors to effect multiplication by powers of two. A particular application of the processor is for processing pulse coded speech signals.

13 Claims, 7 Drawing Sheets

DIGITAL SIGNAL PROCESSORS

This invention relates to a digital signal processor constructed as all or part of an integrated circuit.

Cordless telephones have been produced which enable a user to make telephone calls without having to go to a fixed installation. This enables, for example, business discussions to take place between, say, one person travelling on a train and another travelling in a car. The cordless telephone instrument itself is similar in size and shape to a conventional telephone hand-set and includes a radio transmitter and receiver for communicating with a local telephone network station and some kind of manually operated switch arrangement such as a key-board for entering the telephone number to be selected.

The first forms of such telephones have used analogue signal transmission to convey the speech information, but it has been found that that form of communication is prone to interference from external noise. In order to overcome this problem the conversion of the voice signal to digital form has been proposed, but difficulties have been encountered in providing a sufficiently high bit rate for good quality voice reproduction. It has, for example, been proposed to sample the voice signal at a rate of 8 kHz and to convert each sample to an 8-bit pulse code modulated (PCM) signal. This gives a bit rate of 64K bits per second which has proved to be inconveniently high for radio transmission. A reduction in the bit rate to 32K bits per second can be achieved by converting the PCM signal to adaptive differential pulse code modulation (ADPCM) encoded form. It has been found that this encoding of the voice signal does not detrimentally affect its quality and the resulting reduction in the bit rate renders the use of digital transmission of the voice signal possible without making excessive demands on the radio transmission from the cordless telephone to the network station.

A general purpose microprocessor or microcomputer could be used for implementing the algorithm for converting the PCM signal into the ADPCM encoded form and back again, but cordless telephones have to be battery-powered if they are to be mobile and the use of a general purpose microprocessor or microcomputer requires too great a power consumption from it to operate satisfactory from batteries. In addition, such general purpose microprocessors and microcomputers are relatively expensive.

It is an object of the present invention to provide a digital signal processor in which the power consumption and the complexity of the circuitry are significantly less than those of a general purpose microprocessor or microcomputer but of which its performance in a cordless telephone or any other similar applications is no less satisfactory.

According to the present invention there is provided a digital signal processor incorporated in an integrated circuit and including first and second sources of binary numbers, a parallel binary multiplier having a first input port with a first plurality of conductors for receiving in parallel a first plurality of bits defining a first number, a second input port with a second plurality of conductors for receiving in parallel a second plurality of bits defining a second number, and an output port with a third plurality of conductors for transmitting in parallel a third plurality of bits representing the product of the first and second numbers, the first plurality being substantially larger than the second plurality, a first data selector connected from the first and second sources to the first input port of the multiplier, a second data selector connected from the first and second sources to the second input port of the multiplier, and means for controlling the operation of the first and second data selectors according to the numbers of bits in the numbers from the first and second sources.

The first and/or second data selector may be arranged to be able to select two or more different first and/or second pluralities of bits from the first or second source, thereby enabling the multiplier to multiply numbers having more bits than the first and/or second pluralities.

The first and/or second data selector may include latch means for storing the selected bits, thereby enabling the multiplier to multiply together two numbers from the same source.

A third data selector may be provided connected from the output port to a data bus of the processor to enable the bits representing the product produced by the multiplier to be shifted relative to the conductors of the bus so as to produce the effect of multiplication or division by a power of two.

The first and second sources may be a random access memory (RAM) and a read-only memory (ROM) respectively. A pipe-line register may be included in a connection from the random access memory to a data selector, so as to enable a data item read from the random access memory to be applied to the data selector at the same time as another data item is being applied to the random access memory for storage therein.

The output port of the multiplier may be connected to adding/substracting means to enable the rapid execution of an algorithm for deriving an ADPCM encoded signal from a PCM signal or for deriving a PCM signal from an ADPCM encoded signal.

Figure 1:
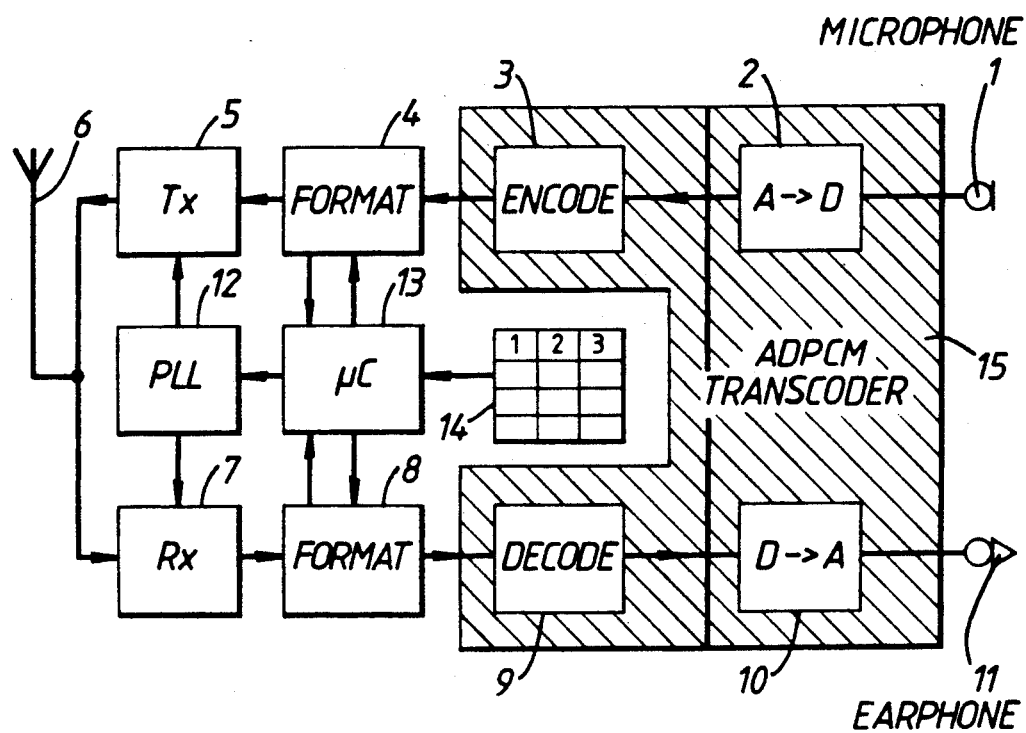
FIG. 1 is a block diagram of the circuitry of a cordless telephone.

In FIG. 1, the circuit of the cordless telephone is shown as a microphone 1 connected through an analogue to digital converter 2 to an encoding circuit 3 which encodes the PCM output from the converter 2 into ADPCM form. The converter 2 is arranged to compress the signal according to the A-Law when it converts it to digital form. The ADPCM signals from the encoder 3 are assembled in a predetermined standard format by the circuit 4 and applied to the transmitter 5 which emits a frequency modulated RF signal which is broadcast via an antenna 6.

RF signals are also received via the antenna 6 and demodulated in a receiver 7 to produce formatted ADPCM encoded signals. A circuit 8 separates the ADPCM signals from synchronising and other signals and applies ADPCM signals to a decoder 9 which regenerates PCM signal from the ADPCM encoded signals received. A digital to analogue converter 10 converts the PCM signals to analogue form and applies them to an ear-phone for reproduction to the user. The frequency of the RF signal emitted by the transmitter 5 and received by the receiver 7 is controlled by a phase-locked loop circuit 12 controlled by a microcomputer 13. The microcomputer also controls the formatting of the ADPCM signals to be transmitted and the separation of the ADPCM signals from the received signals after demodulation. A keyboard 14 is provided to enable the user to enter the telephone numbers with which the user wishes to communicate, the keyboard being connected to the microcomputer 13 which also causes the emission of appropriate calling signals and numerical signals from the transmitter 5 for establishing the required telephone connection. The analogue to digital converter 2 and the digital to analgue converter 10 are included in a single integrated circuit. The encoder 3 and the decoder 9 are included in a second integrated circuit. The two integrated circuits together form an ADPCM transcoder 15.

As the invention is concerned with the construction of the encoder 3 and the decoder 9, it is not proposed to describe the formatting, transmission and reception of signals. These processes may be carried out in any suitable manner.

Figure 2:
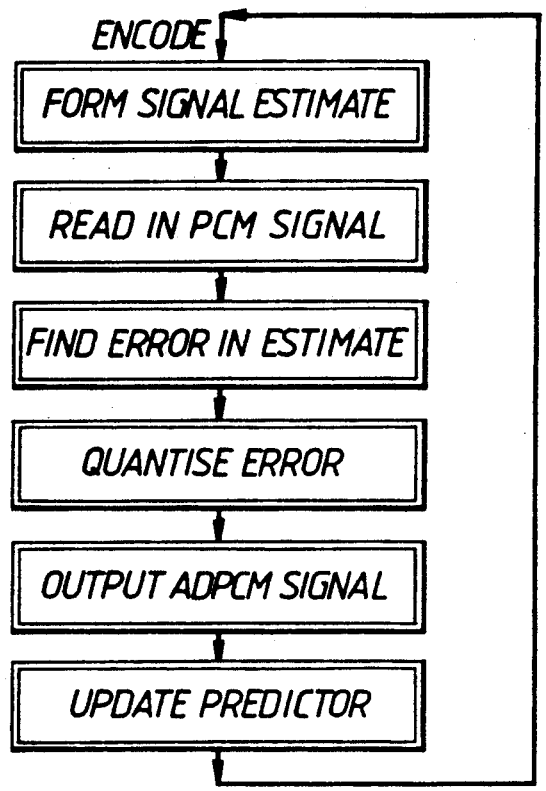
FIG. 2 is a flow diagram of an algorithm for encoding a PCM signal into ADPCM form.

The function of the encoder 3 is to receive the samples from the analogue to digital converter 2 and encode them into ADPCM form. In the example being described, the analogue to digital converter 2 samples the speech signals received from the microphone 1 at a rate of 8000 samples per second, each sample being converted to an 8-bit digital PCM signal. The encoder 3 receives the 8-bit PCM signal and using the algorithm illustrated in FIG. 2 encodes it as a 4-bit ADPCM signal. The algorithm shown in FIG. 2 requires as a first step the generation of an estimate of the next PCM signal to be received on the basis of one or more previous PCM signals. The current PCM signal is then taken in and the difference between that and the estimated signal determined. The value of the error is then quantised and an appropriate digital signal generated which is then output to the formatting circuit as the ADPCM signal. The error is also used to update the prediction and assist in the formation of the estimate for the next PCM signal to be received. Various mathematical techniques may be used to generate the signal estimate from the received PCM signals and many suitable techniques will be well-known to those skilled in the art.

Figure 3:
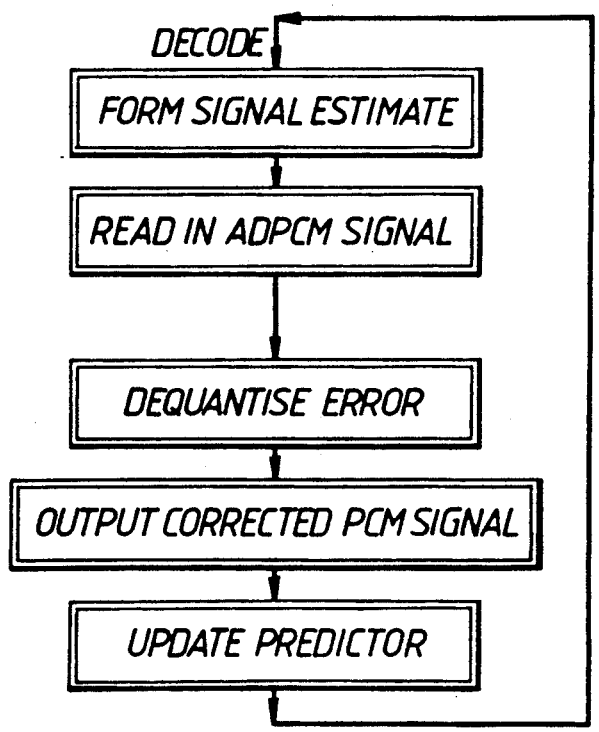
FIG. 3 is a flow diagram of a algorithm for decoding a signal in ADPCM form into a PCM signal.

The decoder 9 performs the reverse operation to the encoder 3, and a flow diagram of its algorithm is shown in FIG. 3. As shown in FIG. 3, a received ADPCM signal is compared with an estimate based on the preceding ADPCM signals and the resulting error is dequantised using the same quantising law as was used in the encoder. The estimate is corrected using the dequantised error and the corrected PCM signal resulting is fed out to the digital to analogue converter 10. The error is also used to update the prediction and assist the formation of the next signal estimate ready for the next ADPCM signal.

Figure 4A:
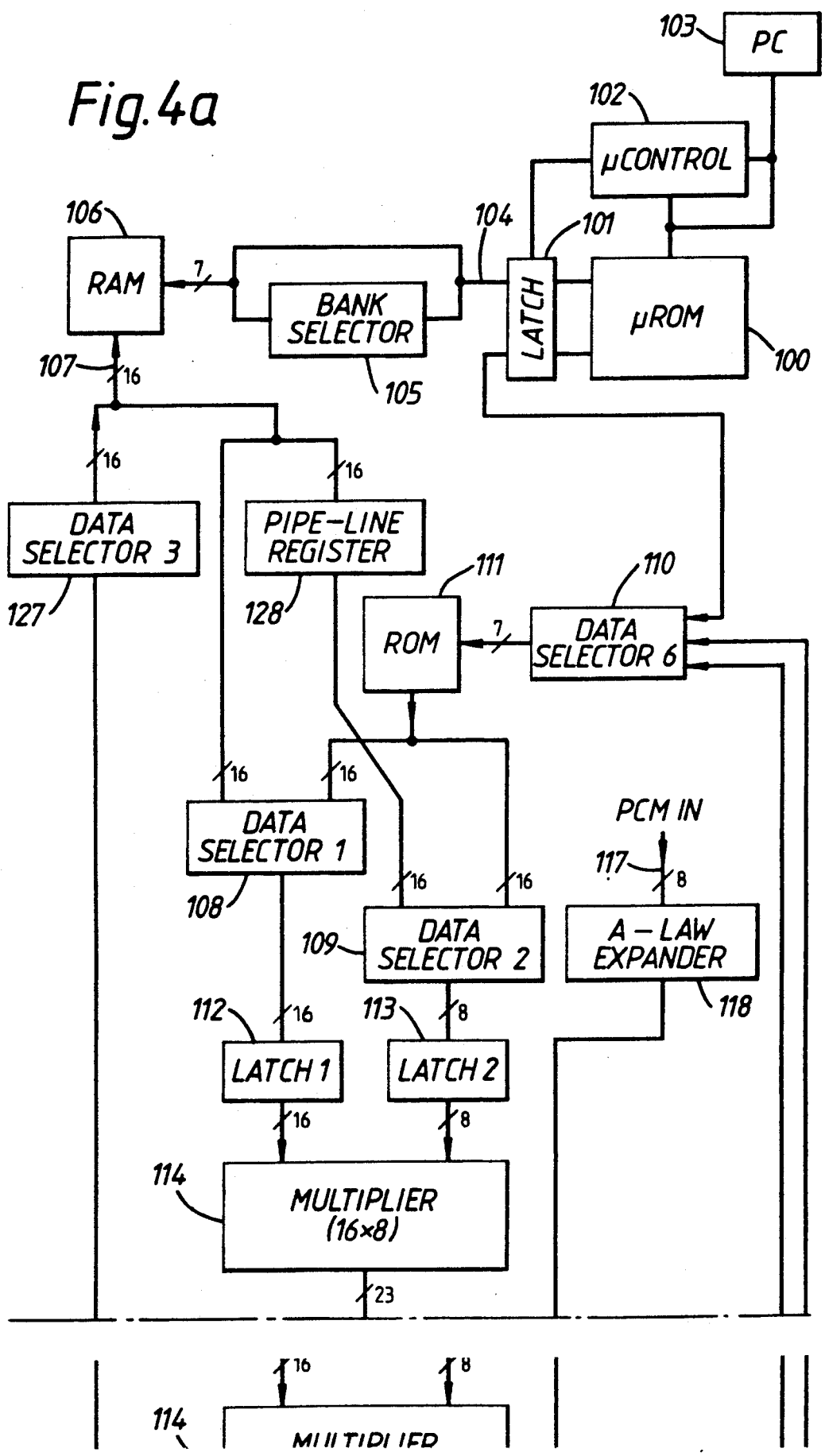
FIGS. 4A and 4B are a block diagram of those parts of a digital signal processor which implement the algorithms shown in FIGS. 2 and 3.
Figure 4B:
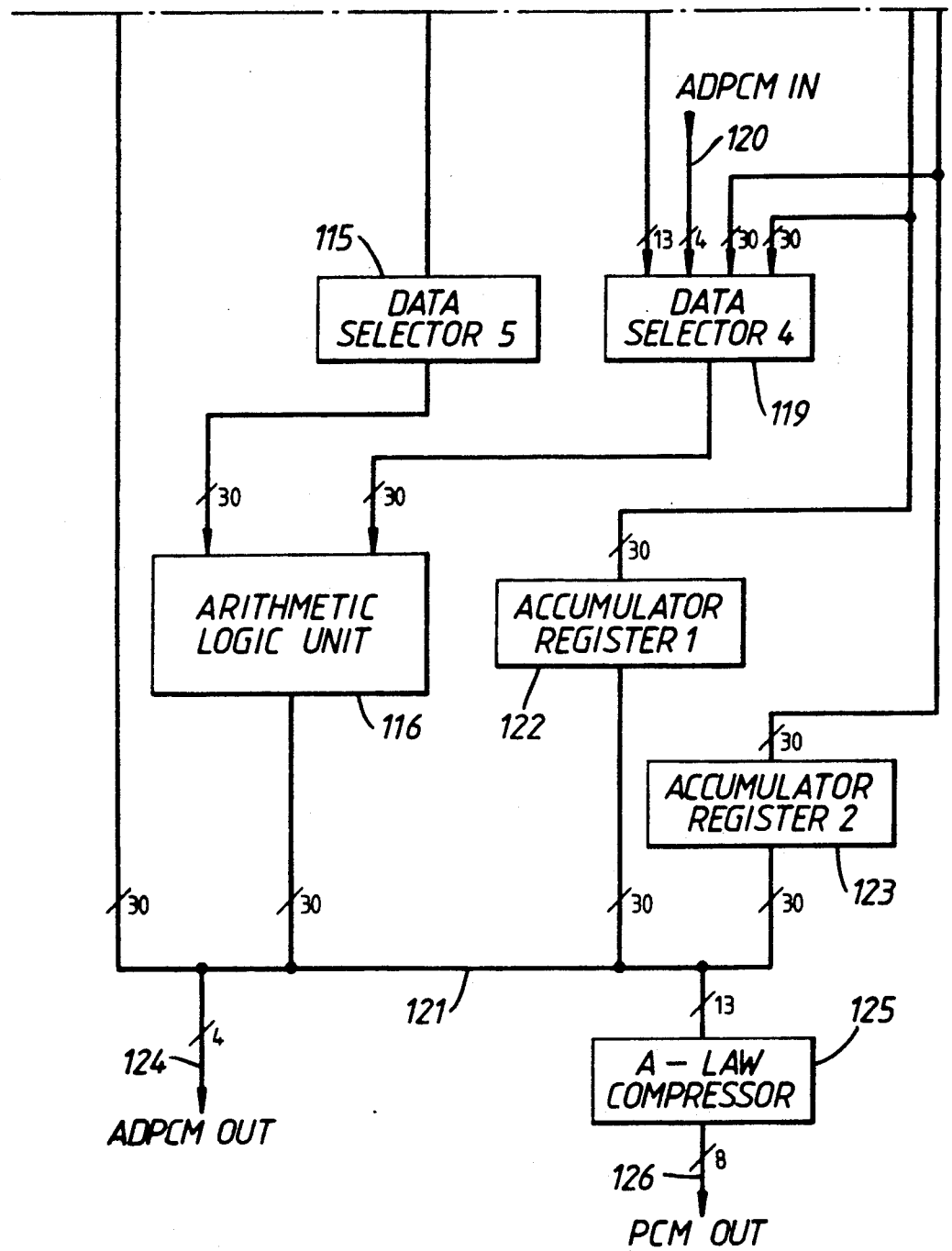

FIGS. 4A and 4B are a block diagram of a digital signal processor used to implement the encoding and decoding functions just described. The instructions for performing the algorithms for the encoding and decoding operations are stored in microcode in a μROM 100 from which they are transferred to a latch 101 and a microcode control unit 102 which in turn addresses the ROM 100. A program counter 103 provides overall control of the unit 102 and the addressing of the ROM 100. Certain of the microcode instructions require data such as intermediate results, to be entered into or read from a RAM 106. The RAM 106 is addressed by data in the latch 101 via a conductor 104 either directly or via a bank selector 105. A 16-line wide input/output bus 107 conveys data to be stored in the RAM 106 or read from it. The bus 107 is connected directly to an input port of data selector 1, having the reference 108, and through a pipe-line register 128 to data selector 2, having the reference 109. These data selectors have second input ports which are connected by 16-line buses to the output of a ROM 101 addressed by the output of a data selector 6, reference number 110, which also receives data from the latch 101. The data selector 108 has a 16-line output bus which is connected to a latch 112. The data selector 109 has an 8-line output bus which is connected to a latch 113. The latches 112 and 113 are connected to respective input ports of a multiplier 114 via a 16-line and an 8-line bus respectively. The multiplier 114 is a parallel or simultaneous twos-complement multiplier and produces a product output on 23-line bus on receiving 16-bit and 8-bit parallel inputs from the latches 112 and 113 respectively. The data selector 5, reference number 115, receives the product output of the multiplier 114 and is able to shift it by up to 7 bits relative to a 30-line bus whih connects the selector 115 to an input port of an arithmetic logic unit 116.

An 8-bit PCM word is received at 117 and applied to an A-Law expander 118. A 13-bit output from the expander 118 is applied via a data selector 4, reference 119, to a 30-line bus connected to a second input port of the ALU 116. A 4-bit ADPCM word can be entered at 120 and applied to a second port of the data selector 119. The ALU 116 has a 30-bit output port which is connected to a 30-line bus 121. The bus 121 is connected to an accumulator register 1, reference number 122, and an accumulator register 2, reference number 123. The outputs of the registers 122 and 123 are connected to respective input ports of data selectors 110 and 119. A 4-bit ADPCM output word is obtained from the bus 121 and appears at 124. Thirteen lines of the bus 121 are connected to the input port of an A-Law compressor 125 having an 8-bit output forming a PCM output word at 126. The bus 121 is also connected to the input port of a data selector 3, reference number 127, having a 16-line output connected to the bus 107.

Data Selector 1+Latch 1 (components 108 and 112)

These perform a data select function between the data read from the RAM 106 and the ROM 111 for the wide, 16-bit, input path of the multiplier 114.

Data Selector 2+Latch 2 (components 109 and 113)

These select data from one of the sources listed below for the narrow, 8-bit, input path of the multiplier 114.

(1) Bits 6-0 of the data read from the ROM 111 with output bit 7 zero.

(2) Bits 6-0 of the data read from the RAM 106 with output bit 7 zero.

(3) Bits 14-7 of the data read from the RAM 106.
(4) Bits 14-8 of the data read from the RAM 106 with output bit 7 equal to bit 6, i.e. sign-extended.

Options 1 and 2 are used when performing the lower accuracy 16-bit signed by 7-bit unsigned multiply operations. While options 2 and 3 are used to perform the 16×15 signed multiply operations. Option 4 is used to provide a divide by 256 function. This configuration is used as in the majority of cases it is only necessary to perform a 16×7 multiply operation.

Data Selector 3 (component 127)

This data selector is used for selecting the part of the output of the accumulator which is required for storing in the RAM 106. It is a three-way selector capable of selecting between:

| Input bits | Output bits |
| --- | --- |
| (1) Bits 15-0 | Bits 15-0 |
| (2) Bits 27-12 | Bits 15-0 |
| (3) Bits 29-15 | Bits 14-0 with output bit 15 equal to bit 14, i.e. sign extended. |

Data Selector 4 (component 119)

This is used to select which of the two accumulator registers 122 and 123 and the two input ports is to be used for one of the ALU 116 inputs. The PCM input via 117 and 118 is zero-extended to produce a 30-bit input while the ADPCM input via 120 is sign-extended to produce a 30-bit input.

Data Selector 5 (component 115)

This data selector is used to shift selectively the output of the multiplier 114 to increase its dynamic range. It can select between the normal output of the multiplier 114 and that of the multiplier 114 multiplied by 32 or 128. The output is always sign-extended to the left (more significant bits) and zero-filled to the right (less significant bits) to produce a 30-bit output value.

Data Selector 6 (component 110)

This is used to select the address for the ROM 111 from one of the accumulator registers 122, 123 or from the microcode stored in the μROM 100. The outputs of the accumulator registers 122 and 123 are truncated to bits (6-0).

Pipe-line Register 128

This is a 16-bit register which can provide temporary storage of data output from the RAM 106. It has three modes of operation determined by two control bits.

(a) In the TRANSPARENT mode, the register does not store the incoming data but transmits them directly to the output with only a small delay between input and output. Any data stored in the register are not affected by the data transmitted.

(b) In the READ-ONLY mode, data stored in the register are output from it to the data selector 2. The register does not store the data applied to its input.

(c) In the READ-WRITE mode, the register stores the data incoming to it and outputs the stored data to the data selector 2 at the same time or at a later time.

Multiplier 114

This is a 16×8 2's complement full parallel multiplier producing a 23 bit 2's complement output.

Arithmetic Logic Unit (ALU) 116

This is an arithmetic unit capable of performing the arithmetic operations + and −, along with the logic operations AND, XOR, pass A and pass B.

Bank Selector

This block of logic divides the RAM 106 into three sections, and provides for bank selection between two of these sections while leaving the third section permanently available. The two bank switched sections are used to store separately in the RAM 106 values to be encoded and those to be decoded, enabling the same microcode subroutines to be used for both encoding and decoding operations, selection being by the bank select switch.

RAM 106

This is a block of 16-bit wide RAM used for storing the ADPCM encoder/decoder variables and for temporary storage purposes.

ROM 111

This is a block of 16-bit wide ROM used for storing the ADPCM encoder/decoder constants.

Accumulator Registers 1 and 2 (components 12 and 123)

These are two 30-bit registers used to store temporary values during arithmetic operations. They can be used to address the ROM 111 directly in place of the microcode from μROM 100. There are two registers so that one register can be used for storage of partially calculated coefficients while the other can simultaneously be used to address calculated addresses in the memory, and so that two previously calculated memory addresses can be accessed for a calculation.

A-Law compressor

Figure 5:
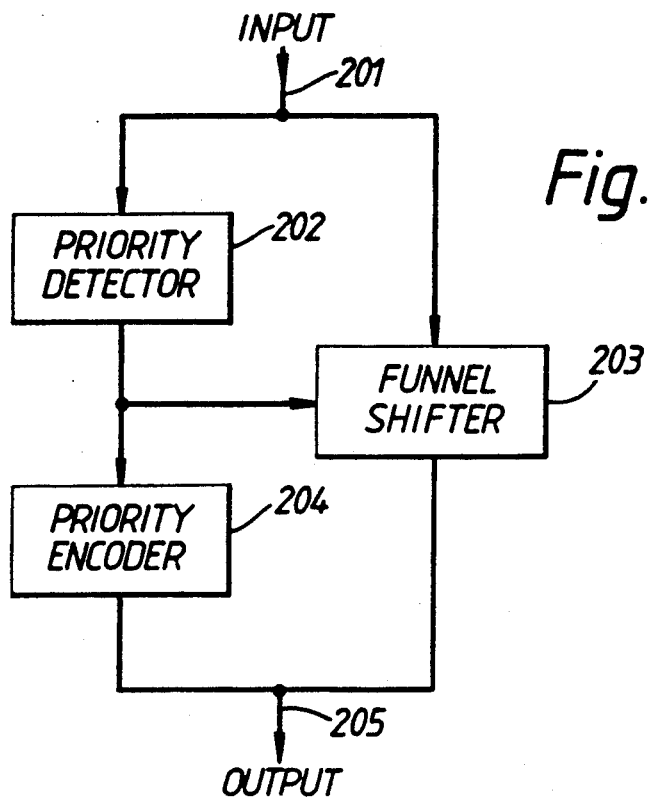
FIG. 5 is a block diagram of a circuit for converting a linearly coded PCM signal into a PCM signal compressed according to the A-law.

A circuit for converting a linearly coded digital signal in sign magnitude format into a digital signal compressed according to the A-Law. This is shown in FIG. 5.

This circuit consists of a priority detector/encoder and a series of four data selectors. The priority detector/encoder receives the six bits of greatest significance of a linearly digitised signal and drives the data selector to perform a four from ten funnel shift, selecting the four sequential bits of the linearly digitised signal to be output as the four bits of least significance of the output compressed signal. The fifth, sixth and seventh bits of least significance selected are from those received by the priority detector by the priorty encoder. The sign bits is a direct copy of the sign bit in the input. The circuitry can also handle linear signals in the range 0-31 (for 11-bit linear + sign bit).

| Input | Priority Detector Output | Priority Encoder Output | Funnel shifter Output |
| --- | --- | --- | --- |
| 1abcdxxxxx | 1000000 | 111 | abcd |
| 01abcdxxxx | 0100000 | 110 | abcd |
| 001abcdxxx | 0010000 | 101 | abcd |
| 0001abcdxx | 0001000 | 100 | abcd |
| 00001abcdx | 0000100 | 011 | abcd |
| 000001abcd | 0000010 | 010 | abcd |
| 000000abcde | 0000001 | 00a | bcde |

A-Law expander 118

Figure 6:
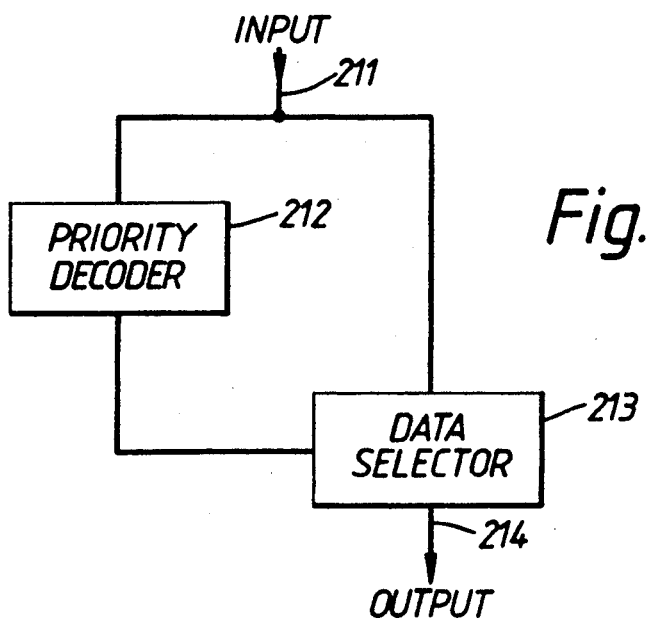
FIG. 6 is a block diagram of a circuit for expanding an A-law coded PCM signal into a linearly coded PCM signal.

A circuit for converting an A-Law coded digital signal into a linearly coded digital signal in sign magnitude format. This is shown in FIG. 6.

This circuit consists of a three-to-seven binary decoder to find the A-Law segment followed by a series of multiplexers of various widths to map the four sub-segment bits onto the relevant bits of the linear data. To improve data quality the circuitry fills an assumed '1' into the linear bit below that for which data is contained in the A-Law sample.

| Input | Priority Decoder Output | Data Selector Output |
|---|---|---|
| 111abcd | 1000000 | 1abcd1000000 |
| 110abcd | 0100000 | 01abcd100000 |
| 101abcd | 0010000 | 001abcd10000 |
| 100abcd | 0001000 | 0001abcd1000 |
| 011abcd | 0000100 | 00001abcd100 |
| 010abcd | 0000010 | 000001abcd10 |
| 00abcde | 0000001 | 000000abcde1 |

A sample, either PCM incoming at 117 or ADPCM incoming at 120, is used to calculate the error in the prediction by subtraction in the ALU 116 and the error is transferred to the RAM 106 to correct the prediction for the next sample. The calculations involved in the prediction are performed by multiplications in the multiplier 114 and additions or subtractions in the ALU 116. The multiplier alone can multiply a 16-bit (15 bits+sign) number by an 8-bit (7 bits+sign) number to give a 23-bit (22 bits+sign) product. By using the data selectors 108, 109, and 115 in conjunction with the multiplier two 16-bit numbers can be multiplied together, one 16-bit number being divided into two 8-bit parts by the data selector 109 and applied in turn to the multiplier, the two separate products being added together by the ALU 114 using an accumulator register and the data selector 119, one product having a leftward shift of 8-bits produced by the data selector 115. It will be understood that the architecture of the processor enables it to operate in a pipelined manner for most calculations (i.e. those that require no 16×16-bit multiplications), so that they can be executed very quickly without the need to recycle partial results, and that even the product of two 16-bit numbers can be produced in about twice the time required for two 16×8-bit multiplications. The pipe-line register 128 is controlled by the program to store selectively the data output by the RAM 106. The register 128 enables data to be written into the RAM 106 and also applied to the multiplier 114 at the same time, thereby providing a useful saving of time in the execution of the program. The output of the ALU can be recycled through the data selector 127 alone or via the RAM 106.

On the other hand, the provision of a 16×8-bit multiplier with some data selectors in place of a 16×16-bit multiplier saves a substantial area of silicon (or other semiconductor) chip.

The data selectors are numbered 1 to 6 for the purpose of identifying them in the program stored in the μROM 100. The listing of the program in microcode forms an appendix to this specification. They implement the encoding and decoding algorithms outlined above with reference to FIGS. 2 and 3. It will be appreciated that the programs executed by the processor will either convert an 8-bit PCM word entered at 117 into a 4-bit ADPCM word output at 124, or will convert a 4-bit ADPCM word entered at 120 into an 8-bit PCM word output at 126.

The converter 2 is arranged to compress according to the A-Law the signal from the microphone 1 as it converts it from analogue to PCM form and the converter 10 is arranged to expand the signals according to the A-Law as it converts them from PCM to analogue form. The converters 2 and 10 are standard items for telecommunications use. Since the algorithms for encoding and decoding the digital signals have to operate on linearly coded digital signals, it is necessary to expand the PCM signals received from the converter 2 before performing the encoding algorithm and to compress the PCM signals resulting from the decoding algorithm before applying them to the converter 10.

Figure 7:
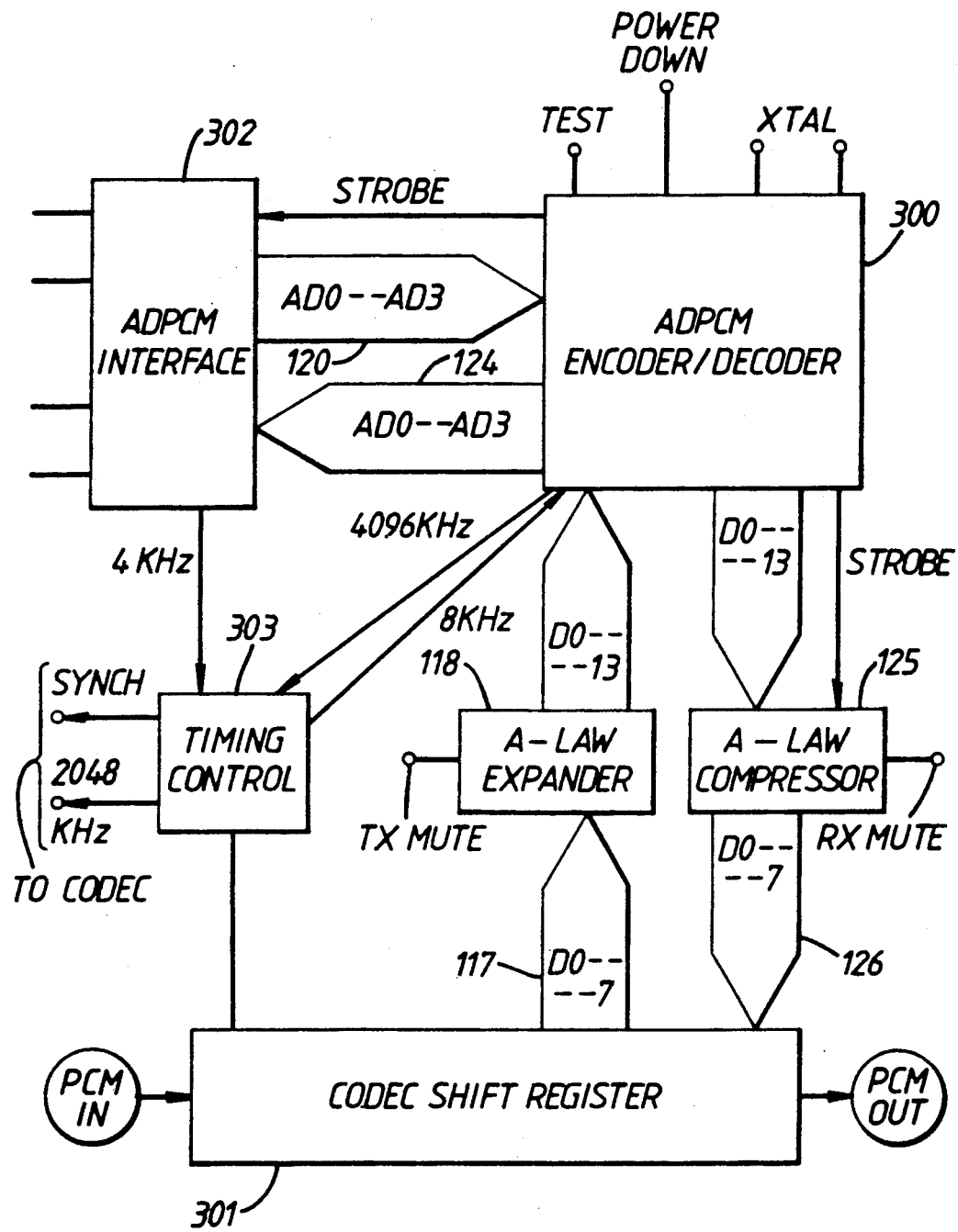
FIG. 7 is a system diagram for the ADPCM transcoder shown in FIG. 1.

FIG. 7 is a block diagram of the whole of the integrated circuit 15 shown in FIG. 1 except for the analogue to digital converter 2 and the digital to analogue converter 10. The components of FIG. 7 which correspond to those shown in FIG. 4 have the same references as in that Figure. The whole of FIG. 4 except for the expander 118 and compressor 125 is included in the rectangle 300. The compressed PCM signal enters on the left of a CODEC shift register 301 and is transferred from that register to the expander 118. Compressed PCM signals are received from the compressor 125 and are output on the right of the register 301. An interface 302 handles the input and output of ADPCM 4-bit words. A timing control circuit 303 supplies clock signals for synchronising the operations of all the components of the integrated circuit.

The integrated circuit itself is constructed from 1-μM CMOS Standard Cells. Details of such standard cells are published in a databook produced by Texas Instruments Incorporated and obtainable from them. If desired, the circuit could be constructed from other types of standard cell, one such type being 2-μM CMOS Standard Cells, a databook describing which is produced by Texas Instruments Incorporated.

Figure 8:
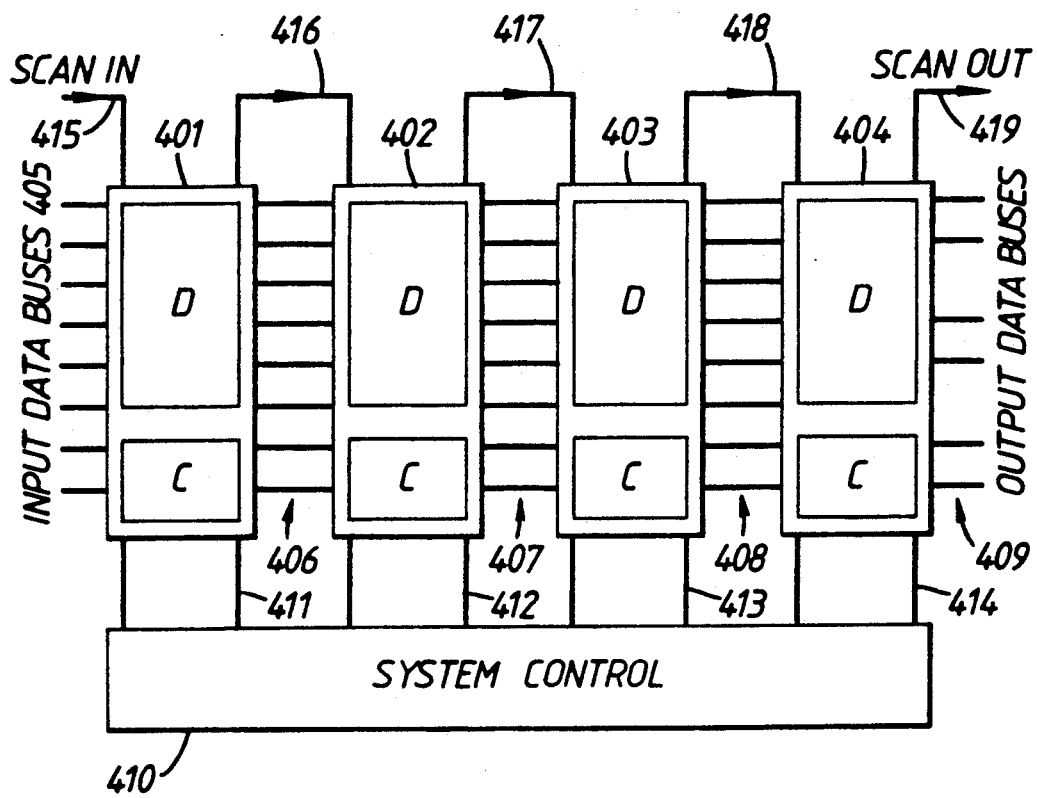
FIG. 8 illustrates one possible lay-out for an integrated circuit form of a digital signal processor constructed using standard cells.

FIG. 8 shows in diagrammatic form one way in which the standard cells could be assembled on a surface of a silicon chip. This particular form of construction is termed strip assembly and shows four standard cells, 401, 402, 403 and 404, having input data buses 405 and interconnecting buses 406, 407 and 408 with the cell 404 driving output buses 409. Each standard cell consists of the data handling part of the cell D and a housekeeping part including input circuits for control signals, buffers, decoders, etc. The housekeeping part of the cell is indicated by the block C. A system control unit 410 is constructed alongside the strip of four standard cells and is connected to each cell through a plurality of conductors represented at 411, 412, 413 and 414 respectively. Each cell also has scan-in and scan-out connections which are connected together from each cell to the adjacent ones. These connections are shown at references 415, 416, 417, 418 and 419.

Although the invention has been described with reference to a specific example of a digital signal processor, it will be understood that many modifications can be made to the example described without departing from the invention. For example, the number of parallel conductors interconnecting components of the processor can differ from those recited with appropriate changes to the complexity of the components. In addition, the multiplier may have input ports with numbers of conductors related by a factor other than 2 with corresponding changes to the numerical shifts which the data selectors can produce.

APPENDIX

```
'###############################################################################
'#                                                                             #
'#              **** DEFINITION FILE FOR THE ADPCM MACRO ****                  #
'#                                                                             #
'#                                                                             #
'#                    Reduced G721 "Grey Book" Microcode                       #
'#                                                                             #
'#                                                                             #
'###############################################################################

'**** DEFINITION FILE FOR THE ADPCM MACRO ****        # THESE DESCRIPTION REFER
.system ADPCM 00000000000000                            TO PATENT DIAGRAM
.format GLOBAL                                          FIG 4.
.width 120   # THESE DESCRIPTION
datsel1_sel1   REFER TO TI     fixed    00000000000000,c00000000000000  ] DATA-SELECTOR 3
datsel1_sel2   INTERNAL        fixed    40000000000000,c00000000000000  } MUX SELECT
datsel1_sel3   DIAGRAM.        fixed    80000000000000,c00000000000000  |
datsel1_sel4                   fixed    c0000000000000,c00000000000000  -
datsel2_sel1                   fixed    00000000000000,30000000000000   ] DATA-SELECTOR 2
datsel2_sel2                   fixed    10000000000000,30000000000000   } MUX SELECT
datsel2_sel3                   fixed    20000000000000,30000000000000   |
datsel2_sel4                   fixed    30000000000000,30000000000000   -
datsel3_low                    fixed    00000000000000,0c000000000000   ] DATA-SELECTOR 5
datsel3_mid                    fixed    04000000000000,0c000000000000   } MUX SELECT
datsel3_hgh                    fixed    08000000000000,0c000000000000   |
datsel3_tie                    fixed    0c000000000000,0c000000000000   -
datsel4_sel1                   fixed    00000000000000,03000000000000   ] DATA-SELECTOR 6
datsel4_sel2                   fixed    01000000000000,03000000000000   } MUX SELECT
datsel4_sel3                   fixed    02000000000000,03000000000000   |
datsel4_sel4                   fixed    03000000000000,03000000000000   -
write_acc1                     fixed    00800000000000,00800000000000   ] REGISTER 1/2 WRITE
write_acc2                     fixed    00040000000000,00040000000000   ] READ PERMANENTLY ON
alumux_acc1                    fixed    00000000000000,00600000000000   ]
alumux_acc2                    fixed    00200000000000,00600000000000   } ALU INPUT MUX SELECT
adpcminp                       fixed    00400000000000,00600000000000   | FROM THE REGISTER SIDE
pcminp                         fixed    00600000000000,00600000000000   -
ram_sel                        fixed    00100000000000,00100000000000   ] RAM SELECT (ENABLE)
ram_rw                         fixed    00080000000000,00080000000000   ] RAM READ/WRITE SELECT
ram_bank_low                   fixed    00020000000000,00020000000000   ] RAM PAGE SELECT (BANK SELECTOR)
ram_bank_hgh                   fixed    00010000000000,00010000000000   ] (0-32, 32-64, 64-128)
ram_addr                       variable 0000fc00000000,0000fc00000000   ] RAM ADDRESS
rom_addr                       variable 000000000000fe,000000000000fe   ] ROM ADDRESS
rom_sel                        fixed    00000000000400,00000000000400   ] ROM ENABLE
mux_rom                        fixed    00000000000000,00000200000000   ] DATA-SELECTOR 1 (ROM,RAM)
mux_ram                        fixed    00000200000000,00000200000000   -
write_lat1                     fixed    00000100000000,00000100000000   ] MULTIPLIER LATCH 1
write_lat2                     fixed    00000080000000,00000080000000   ] MULTIPLIER LATCH 2
romuc_addr                     variable 0000007fc00000,0000007fc00000   ] MICRO-CODE JUMP ADDRESS
alu_clr                        fixed    00000000040000,000000001c0000   ] CLEAR
alu_xmy                        fixed    00000000080000,000000001c0000   | X MINUS Y
alu_xpy                        fixed    000000000c0000,000000001c0000   | X PLUS Y        ALU
alu_pasx                       fixed    00000000100000,000000001c0000   | PASS X          FUNCTION
alu_pasy                       fixed    00000000140000,000000001c0000   | PASS Y          SELECT
alu_xeoy                       fixed    00000000180000,000000001c0000   | X EXOR Y
alu_xory                       fixed    000000001c0000,000000001c0000   | X OR Y
alu_xany                       fixed    00000000000000,000000001c0000   | X AND Y
alu_xlty                       fixed    00000000080000,000000001c0000   | X LESS THAN Y
alu_xgty                       fixed    00000000080000,000000001c0000   | X GREATER THAN Y
alu_xeqy                       fixed    00000000080000,000000001c0000   - X EQUAL TO Y        [MICROCODE CONTROL]
jmp_con                        fixed    00000000020000,00000000020000   JUMP CONDITIONALLY
jmp_ucon                       fixed    00000000010000,00000000010000   JUMP UNCONDITIONALLY
push_pc                        fixed    00000000008000,00000000008000   STORE LAST ADDRESS BEFORE JUMP
pop_pc                         fixed    00000000004000,00000000004000   BACK TO PREVIOUS STORED ADDRESS
mux_selr                       fixed    00000000000000,00000000003800   ] CONTROL LOGIC MUX TO
mux_seln                       fixed    00000000000800,00000000003800   } SELECT CONDITION CHECKS
mux_selz                       fixed    00000000001000,00000000003800   ] NEGATIVE/ZERO/RX-MUTE
                                                                        CONTD:
mux_sync                       fixed    00000000001800,00000000003800   ] SYNC FLAG TO START ALGORITHM
mux_selp                       fixed    00000000002000,00000000003800   ] CONTROL LOGIC CONDITION
mux_selle                      fixed    00000000002800,00000000003800   } MUX - TO CHECK INCOMING
mux_sel_sgnmag                 fixed    00000000003000,00000000003800   | STATUS OF SIDETONE/SIGN-MAG
mux_sel_sidetone               fixed    00000000003800,00000000003800   -
```

```
pcm_out              fixed    00000000000200,00000000000200  ] CONTROL BIT TO LATCH PCM-OUT
adpcm_out            fixed    00000000000100,00000000000100  ] CONTROL BIT TO LATCH ADPCM-OUT
lat3                 fixed    00000000000001,00000000000001  ] PIPELINE REGISTER CONTROL.
else                 fixed    00000000000000,00000000000000  ] NO OPERATION.
goto                 macro    jmp_ucon romuc_addr
jmpz                 macro    mux_selz jmp_con romuc_addr
jmpn                 macro    mux_seln jmp_con romuc_addr
jmpp                 macro    mux_selp jmp_con romuc_addr
jmple                macro    mux_selle jmp_con romuc_addr
jmp_sgnmag           macro    mux_sel_sgnmag   jmp_con romuc_addr
jmp_sidetone         macro    mux_sel_sidetone jmp_con romuc_addr
jmp_sub              macro    jmp_ucon push_pc romuc_addr
return               macro    jmp_ucon pop_pc
jmp_rx               macro    mux_selr jmp_con romuc_addr
while_not_sync       macro    mux_sync jmp_con romuc_addr
set_sync             macro    datsell_sel4
mem_ramr             macro    ram_sel ram_rw ram_addr
mem_rama             macro    ram_sel ram_rw datsel4_sel4
mem_ramw             macro    ram_sel ram_addr
mem_rawa             macro    ram_sel datsel4_sel4
mem_romr             macro    rom_sel rom_addr datsel4_sel1
mem_roma             macro    rom_sel datsel4_sel2
mem_romb             macro    rom_sel datsel4_sel3

'load latch2
load_12<<rambus      macro    mux_ram write_lat2
load_12<<ram         macro    mux_ram write_lat2 ram_sel ram_addr ram_rw
load_12<<rom         macro    mux_rom write_lat2 rom_sel rom_addr ' These are the more readable indexed memory mnemonics
load_12<<rom(a1)     macro    mux_rom write_lat2 rom_sel datsel4_sel3
load_12<<rom(a2)     macro    mux_rom write_lat2 rom_sel datsel4_sel2
load_12<<ram(a1)     macro    mux_rom write_lat2 mem_rama
load_11_s4<<rom(a1)  macro    datsel2_sel4 write_lat1 rom_sel datsel4_sel3
load_11_s4<<rom(a2)  macro    datsel2_sel4 write_lat1 rom_sel datsel4_sel2
store_0>>ram(a1)     macro    alu_clr datsell_sel3 mem_rawa
store_x>>ram(a1)     macro    datsel3_low alu_pasx datsell_sel3 mem_rawa ' These are no longer used after SFG5, but are kept for compiling older versions
'load_12<<rom(a)     macro    mux_rom write_lat2 rom_sel datsel4_sel2
'load_12<<rom(b)     macro    mux_rom write_lat2 rom_sel datsel4_sel3
'load_12<<ram(a)     macro    mux_rom write_lat2 mem_rama
'load_11_s4<<rom(a)  macro    datsel2_sel4 write_lat1 rom_sel datsel4_sel2
'load_11_s4<<rom(b)  macro    datsel2_sel4 write_lat1 rom_sel datsel4_sel3
'store_0>>ram(a)     macro    alu_clr datsell_sel3 mem_rawa
'store_x>>ram(a)     macro    datsel3_low alu_pasx datsell_sel3 mem_rawa 'load latch1
load_11_s1<<rambus   macro    datsel2_sel1 write_lat1
load_11_s2<<rambus   macro    datsel2_sel2 write_lat1
load_11_s3<<rambus   macro    datsel2_sel3 write_lat1
load_11_s1<<ram      macro    datsel2_sel1 write_lat1 ram_sel ram_addr ram_rw
load_11_s2<<ram      macro    datsel2_sel2 write_lat1 ram_sel ram_addr ram_rw
load_11_s3<<ram      macro    datsel2_sel3 write_lat1 ram_sel ram_addr ram_rw
load_11_s4<<rom      macro    datsel2_sel4 write_lat1 rom_sel rom_addr
load_11_s1<<pipe_reg macro    datsel2_sel1 write_lat1
load_11_s2<<pipe_reg macro    datsel2_sel2 write_lat1
load_11_s3<<pipe_reg macro    datsel2_sel3 write_lat1
load_pipe_reg<<ram   macro    lat3 ram_sel ram_addr ram_rw 'load acc 1
load_x>>a1           macro    datsel3_low alu_pasx wri _acc1
load_32x>>a1         macro    datsel3_mid alu_pasx write_acc1
load_128x>>a1        macro    datsel3_hgh alu_pasx write_acc1
load_x-a1>>a1        macro    datsel3_low alumux_acc1 write_acc1 alu_xmy
load_32x-a1>>a1      macro    datsel3_mid alumux_acc1 write_acc1 alu_xmy
load_128x-a1>>a1     macro    datsel3_hgh alumux_acc1 write_acc1 alu_xmy
load_x+a1>>a1        macro    datsel3_low alumux_acc1 write_acc1 alu_xpy
load_32x+a1>>a1      macro    datsel3_mid alumux_acc1 write_acc1 alu_xpy
load_128x+a1>>a1     macro    datsel3_hgh alumux_acc1 write_acc1 alu_xpy
load_x_eo_a1>>a1     macro    datsel3_low alumux_acc1 write_acc1 alu_xeoy
load_0>>a1           macro    datsel3_tie write_acc1 alu_pasx
```

```
load_0-a1>>a1                  macro datsel3_tie alumux_acc1 write_acc1 alu_xmy
load_x-a2>>a1                  macro datsel3_low alumux_acc2 write_acc1 alu_xmy
load_x+a2>>a1                  macro datsel3_low alumux_acc2 alu_xpy write_acc1
load_pcminp>>a1                macro pcminp alu_pasy write_acc1
load_x_and_a1>>a1              macro datsel3_low alumux_acc1 alu_xany write_acc1
load_x-pcminp>>a1              macro datsel3_low pcminp alu_xmy write_acc1

'load acc2
load_x>>a2                     macro datsel3_low alu_pasx write_acc2
load_32x>>a2                   macro datsel3_mid alu_pasx write_acc2
load_128x>>a2                  macro datsel3_hgh alu_pasx write_acc2
load_x-a2>>a2                  macro datsel3_low alumux_acc2 write_acc2 alu_xmy
load_32x-a2>>a2                macro datsel3_mid alumux_acc2 write_acc2 alu_xmy
load_128x-a2>>a2               macro datsel3_hgh alumux_acc2 write_acc2 alu_xmy
load_x+a2>>a2                  macro datsel3_low alumux_acc2 write_acc2 alu_xpy
load_32x+a2>>a2                macro datsel3_mid alumux_acc2 write_acc2 alu_xpy
load_128x+a2>>a2               macro datsel3_hgh alumux_acc2 write_acc2 alu_xpy
load_128x-a1>>a2               macro datsel3_hgh alumux_acc1 write_acc2 alu_xmy
load_128x+a1>>a2               macro datsel3_hgh alumux_acc1 write_acc2 alu_xpy
load_x_eo_a2>>a2               macro datsel3_low alumux_acc2 write_acc2 alu_xeoy
load_0>>a2                     macro datsel3_tie alu_pasx write_acc2
load_0-a2>>a2                  macro datsel3_tie alumux_acc2 write_acc2 alu_xmy
load_x-a1>>a2                  macro datsel3_low alumux_acc1 write_acc2 alu_xmy
load_x+a1>>a2                  macro datsel3_low alumux_acc1 alu_xpy write_acc2

'store to ram
store_0>>ram                   macro alu_clr datsel1_sel3 mem_ramw
store_x>>ram_l                 macro datsel3_low alu_pasx datsel1_sel1 mem_ramw
store_x>>ram_m                 macro datsel3_low alu_pasx datsel1_sel2 mem_ramw
store_x>>ram_h                 macro datsel3_low alu_pasx datsel1_sel3 mem_ramw
store_32x>>ram_l               macro datsel3_mid alu_pasx datsel1_sel1 mem_ramw
store_32x>>ram_m               macro datsel3_mid alu_pasx datsel1_sel2 mem_ramw
store_32x>>ram_h               macro datsel3_mid alu_pasx datsel1_sel3 mem_ramw
store_128x>>ram_l              macro datsel3_hgh alu_pasx datsel1_sel1 mem_ramw
store_128x>>ram_m              macro datsel3_hgh alu_pasx datsel1_sel2 mem_ramw
store_128x>>ram_h              macro datsel3_hgh alu_pasx datsel1_sel3 mem_ramw
store_a1>>ram_h                macro alumux_acc1 alu_pasy datsel1_sel3 mem_ramw
store_a2>>ram_m                macro alumux_acc2 alu_pasy datsel1_sel2 mem_ramw
store_a2>>ram_h                macro alumux_acc2 alu_pasy datsel1_sel3 mem_ramw
store_0-a1>>ram_h              macro datsel3_tie alumux_acc1 alu_xmy datsel1_sel3 mem_ramw
store_0-a2>>ram_h              macro datsel3_tie alumux_acc2 alu_xmy datsel1_sel3 mem_ramw
store_x+a1>>ram_l              macro datsel3_low alumux_acc1 alu_xpy datsel1_sel1 mem_ramw
store_x+a1>>ram_m              macro datsel3_low alumux_acc1 alu_xpy datsel1_sel2 mem_ramw
store_x+a1>>ram_h              macro datsel3_low alumux_acc1 alu_xpy datsel1_sel3 mem_ramw
store_128x+a1>>ram_m           macro datsel3_hgh alumux_acc1 alu_xpy datsel1_sel2 mem_ramw
store_128x+a2>>ram_m           macro datsel3_hgh alumux_acc2 alu_xpy datsel1_sel2 mem_ramw
store_128x+a2>>ram_h           macro datsel3_hgh alumux_acc2 alu_xpy datsel1_sel3 mem_ramw
store_adpcminp>>ram_m          macro adpcminp alu_pasy datsel1_sel2 mem_ramw
store_x_and_a1>>ram_h          macro datsel3_low alumux_acc1 alu_xany datsel1_sel3 mem_ramw
store_128x_and_a1>>ram_m       macro datsel3_hgh alumux_acc1 alu_xany datsel1_sel2 mem_ramw
store_x_eo_adpcminp>>ram_h     macro datsel3_low adpcminp alu_xeoy datsel1_sel3 mem_ramw 'load acc1 and acc2
load_x>>a1_a2                  macro datsel3_low alu_pasx write_acc1 write_acc2
load_128x+a1>>a1_a2            macro datsel3_hgh alu_xpy alumux_acc1 write_acc1 write_acc2

'store to ram and acc1
store_0>>a1_ram                macro datsel3_tie alu_clr write_acc1 datsel1_sel3 mem_ramw
store_0-a1>>a1_ram_l           macro datsel3_tie alumux_acc1 alu_xmy write_acc1 datsel1_sel1
store_0-a1>>a1_ram_h           macro datsel3_tie alumux_acc1 alu_xmy write_acc1 datsel1_sel3 store_x>>a1_ram_m              macro datsel3_low alu_pasx write_acc1 datsel1_sel2 mem_ramw
store_x>>a1_ram_h              macro datsel3_low alu_pasx write_acc1 datsel1_sel3 mem_ramw
store_x>>a2_ram_h              macro datsel3_low alu_pasx write_acc2 datsel1_sel3 mem_ramw
store_128x>>a1_ram_m           macro datsel3_hgh alu_pasx write_acc1 datsel1_sel2 mem_ramw
store_x+a1>>a1_ram_l           macro datsel3_low alumux_acc1 alu_xpy write_acc1 datsel1_sel1
store_x+a1>>a1_ram_m           macro datsel3_low alumux_acc1 alu_xpy write_acc1 datsel1_sel2
store_x+a1>>a1_ram_h           macro datsel3_low alumux_acc1 alu_xpy write_acc1 datsel1_sel3
store_x+a1>>a2_ram_h           macro datsel3_low alumux_acc1 alu_xpy write_acc2 datsel1_sel3
store_x>>a1_a2_ram_h           macro datsel3_low alu_pasx write_acc1 write_acc2 datsel1_sel3 store_32x+a1>>a1_ram_m         macro datsel3_mid alumux_acc1 alu_xpy write_acc1 datsel1_sel2
store_128x+a1>>a1_ram_l        macro datsel3_hgh alumux_acc1 alu_xpy write_acc1 datsel1_sel1
```

```
store_128x+a1>>a1_ram_m         macro datsel3_hgh alumux_acc1 alu_xpy write_acc1 datsel1_sel2
store_128x+a1>>a1_ram_h         macro datsel3_hgh alumux_acc1 alu_xpy write_acc1 datsel1_sel3
store_128x-a1>>a1_ram_l         macro datsel3_hgh alumux_acc1 alu_xmy write_acc1 datsel1_sel1
store_128x-a1>>a1_ram_m         macro datsel3_hgh alumux_acc1 alu_xmy write_acc1 datsel1_sel2
store_128x-a1>>a1_ram_h         macro datsel3_hgh alumux_acc1 alu_xmy write_acc1 datsel1_sel3
store_128x_and_a1>>a1_ram_l     macro datsel3_hgh alumux_acc1 alu_xany write_acc1 datsel1_sel1
store_128x_and_a1>>a1_ram_m     macro datsel3_hgh alumux_acc1 alu_xany write_acc1 datsel1_sel2

'if statements
if_x_LT_0_then_jmp              macro datsel3_low alu_pasx jmpn
if_x_GE_0_then_jmp              macro datsel3_low alu_pasx jmpp
if_128x_LT_0_then_jmp           macro datsel3_hgh alu_pasx jmpn
if_128x_GE_0_then_jmp           macro datsel3_hgh alu_pasx jmpp
if_128x+a1_LT_0_then_jmp        macro datsel3_hgh alu_xpy jmpn
if_128x+a1_GE_0_then_jmp        macro datsel3_hgh alu_xpy jmpp
if_x+a1_LT_0_then_jmp           macro datsel3_low alumux_acc1 alu_xpy jmpn
if_x+a1_GE_0_then_jmp           macro datsel3_low alumux_acc1 alu_xpy jmpp
if_x+a2_LT_0_then_jmp           macro datsel3_low alumux_acc2 alu_xpy jmpn
if_x+a2_GE_0_then_jmp           macro datsel3_low alumux_acc2 alu_xpy jmpp
if_x-a1_LT_0_then_jmp           macro datsel3_low alumux_acc1 alu_xmy jmpn
if_x-a1_GE_0_then_jmp           macro datsel3_low alumux_acc1 alu_xmy jmpp
if_x-a2_LT_0_then_jmp           macro datsel3_low alumux_acc2 alu_xmy jmpn
if_x-a2_GE_0_then_jmp           macro datsel3_low alumux_acc2 alu_xmy jmpp
if_x_LT_a1_then_jmp             macro datsel3_low alumux_acc1 alu_xmy jmpn
if_x_GE_a1_then_jmp             macro datsel3_low alumux_acc1 alu_xmy jmpp
if_x_LT_a2_then_jmp             macro datsel3_low alumux_acc2 alu_xmy jmpn
if_x_GE_a2_then_jmp             macro datsel3_low alumux_acc2 alu_xmy jmpp if_x=a2_then_jmp                macro datsel3_low alumux_acc2 alu_xeqy jmpz
if_x=a1_then_jmp                macro datsel3_low alumux_acc1 alu_xeqy jmpz
if_x_LT_pcminp_then_jmp         macro datsel3_low pcminp alu_xmy jmpn
if_x=pcminp_then_jmp            macro datsel3_low pcminp alu_xmy jmpz
if_x_eo_a1=0_then_jmp           macro datsel3_low alumux_acc1 alu_xeoy jmpz
if_x+a2=0_then_jmp              macro datsel3_low alumux_acc2 alu_xpy jmpz
if_128x_LT_a1_then_jmp          macro datsel3_hgh alumux_acc1 alu_xmy jmpn
if_a1=0_then_jmp                macro alumux_acc1 alu_pasy jmpz
if_x=0_then_jmp                 macro alu_pasx jmpz
if_a1_GT_0_then_jmp             macro datsel3_tie alumux_acc1 alu_xmy jmpn
if_a2_GT_0_then_jmp             macro datsel3_tie alumux_acc2 alu_xmy jmpn
if_a1_LT_0_then_jmp             macro alumux_acc1 alu_pasy jmpn
if_a2_LT_0_then_jmp             macro alumux_acc2 alu_pasy jmpn
if_a1_LE_0_then_jmp             macro alumux_acc1 alu_pasy jmple
if_a1_GE_0_then_jmp             macro alumux_acc1 alu_pasy jmpp
if_a2_GE_0_then_jmp             macro alumux_acc2 alu_pasy jmpp
if_RX_MUTE_then_jmp             macro jmp_rx 'test flag only
if_x_LT_0_then_jmpt             macro jmpn
if_x_GE_0_then_jmpt             macro jmpp
if_128x_LT_0_then_jmpt          macro jmpn
if_128x_GE_0_then_jmpt          macro jmpp
if_x+a1_LT_0_then_jmpt          macro jmpn
if_x+a1_GE_0_then_jmpt          macro jmpp
if_x+a2_LT_0_then_jmpt          macro jmpn
if_x+a2_GE_0_then_jmpt          macro jmpp
if_x-a1_LT_0_then_jmpt          macro jmpn
if_x-a1_GE_0_then_jmpt          macro jmpp
if_x-a2_LT_0_then_jmpt          macro jmpn
if_x-a2_GE_0_then_jmpt          macro jmpp
if_x_LT_a1_then_jmpt            macro jmpn
if_x_GE_a1_then_jmpt            macro jmpp
if_x_LT_a2_then_jmpt            macro jmpn
if_x_GE_a2_then_jmpt            macro jmpp
if_x=a2_then_jmpt               macro jmpz
if_a2_lt_0_then_jmpt            macro jmpn
if_x=a1_then_jmpt               macro jmpz
if_x_LT_pcminp_then_jmpt        macro jmpn
if_x=pcminp_then_jmpt           macro jmpz
if_x_eo_a1=0_then_jmpt          macro jmpz
if_x+a2=0_then_jmpt             macro jmpz
if_128x_LT_a1_then_jmpt         macro jmpn
if_a1=0_then_jmpt               macro jmpz
```

```
if_x=0_then_jmpt            macro jmpz
if_a1_GT_0_then_jmpt        macro jmpn
if_a2_GT_0_then_jmpt        macro jmpn
if_a1_LT_0_then_jmpt        macro jmpn
output_pcm_out<<x           macro datsel3_low alu_pasx pcm_out
output_pcm_out<<a1          macro alumux_acc1 alu_pasy pcm_out
output_pcm_out<<x-a1        macro datsel3_low alumux_acc1 alu_xmy pcm_out
adpcm_out<<a1               macro alumux_acc1 alu_pasy adpcm_out
adpcm_out<<x                macro adpcm_out
.end
```

```
'###############################   ###############################   ############
'#                                                                                #
'#         ####### SOURCE FILE FOR THE ADPCM SYSTEM #######                       #
'#                                                                                #
'#                                                                                #
'#              - MEGAMODULES GROUP.                                              #
'#                                                                                #
'#              - ASIC DESIGN CENTRE, BEDFORD (TIL).                              #
'#                                                                                #
'#              Reduced G721 "Grey Book" Microcode                                #
'#                                                                                #
'##################################################################################
' ROM Declaration
        .EQU    d1       0
        .EQU    d2       1
        .EQU    d4       2
        .EQU    d8       3
        .EQU    d16      4
        .EQU    d32      5
        .EQU    d64      6
        .EQU    d128     7
        .EQU    d256     8
        .EQU    d512     9
        .EQU    d1024    10
        .EQU    d2048    11
        .EQU    d4096    12
        .EQU    d8192    13
        .EQU    d63488   14
        .EQU    d65524   15
        .EQU    d0       16
        .EQU    d4a      17
        .EQU    d18      18
        .EQU    d0a      19
        .EQU    d135     20
        .EQU    d41      21
        .EQU    d0b      22
        .EQU    d213     23
        .EQU    d64a     24
        .EQU    d16a     25
        .EQU    d273     26
        .EQU    d112     27
        .EQU    d16b     28
        .EQU    d323     29
        .EQU    d198     30
        .EQU    d16c     31
        .EQU    d373     32
        .EQU    d355     33
        .EQU    d48      34
        .EQU    d425     35
        .EQU    d1122    36
        .EQU    d112a    37
        .EQU    d65      38
        .EQU    d68      39
        .EQU    d71      40
        .EQU    d74      41
```

```
        .EQU       d78        42
        .EQU       d81        43
        .EQU       d85        44
        .EQU       d89        45
        .EQU       d92        46
        .EQU       d97        47
        .EQU       d101       48
        .EQU       d105       49
        .EQU       d110       50
        .EQU       d115       51
        .EQU       d120       52
        .EQU       d125       53
        .EQU       d9         54
        .EQU       d11        55
        .EQU       d13        56
        .EQU       d502       57
        .EQU       d605       58
        .EQU       d3         59
        .EQU       d656       60
        .EQU       d336       61
        .EQU       d5         62
        .EQU       d6         63
        .EQU       d7         64
        .EQU       d124       65
        .EQU       d544       66
        .EQU       d5120      67
        .EQU       d126       68
        .EQU       d63        69
        .EQU       d4095      70
        .EQU       d127       71
        .EQU       d12        72
        .EQU       d12288     73
        .EQU       d15        74
        .EQU       d65535     75
        .EQU       d434       76
        .EQU       d65534     77
        .EQU       d10        78
        .EQU       d65504     79
        .EQU       d14        80
        .EQU       d38        81
        .EQU       d53        82
        .EQU       d132       83
        .EQU       d53760     84
        .EQU       d21845     85
        .EQU       d79        86
        .EQU       d95        87
        .EQU       d31        88
        .EQU       d11776     89
        .EQU       d1536      90
        .EQU       d3968      91
        .EQU       d4064      92
        .EQU       d3840      93
        .EQU       d204       94
        .EQU       d556       95
' END ROM Declaration ' RAM Declaration
        .EQU       SDQ6       0
        .EQU       SDQ5       1
        .EQU       SDQ4       2
        .EQU       SDQ3       3
        .EQU       SDQ2       4
        .EQU       SDQ1       5
        .EQU       YU         6
```

```
        .EQU    YLH     7
        .EQU    PK0     8
        .EQU    PK1     9
        .EQU    YLL     10
        .EQU    DQ      11
        .EQU    DQ1     12
        .EQU    DQ2     13
        .EQU    DQ3     14
        .EQU    DQ4     15
        .EQU    DQ5     16
        .EQU    SR1     17
        .EQU    SR      18
        .EQU    APP     19
        .EQU    B1      20
        .EQU    B2      21
        .EQU    B3      22
        .EQU    B4      23
        .EQU    B5      24
        .EQU    B6      25
        .EQU    A2      26
        .EQU    A1      27
        .EQU    DMS     28
        .EQU    DML     29
        .EQU    TDPP    30
        .EQU    TR      31
        .EQU    YN      32
        .EQU    YX      33
        .EQU    TEMP1   34
        .EQU    TEMP4   35
        .EQU    SE      36
        .EQU    SEZ     37
        .EQU    AL      38
        .EQU    Y       39
        .EQU    YOVER4  40
        .EQU    SIGN    41
        .EQU    O_IM    42
        .EQU    O_SDQ   42
        .EQU    O_PK2   42
        .EQU    I       43
        .EQU    TEMP2   44
        .EQU    Z       45
        .EQU    R32     46
        .EQU    R1024   47
' END RAM Declaration

'       ########## START CODING PROCEDURE ############

'INITIALISE RAM VARIABLES FOR CODE( PCM ) PROCEDURE

'SET MEMORY BANK LOCATION - LOW (0 - 29  LOW )
.xref
.org 0
MEM_LOW:    ram_bank_low load_12<<rom(d31) jmp_sub(SETUP);
MEM_HGH:    alu_clr pcm_out set_sync ram_bank_hgh load_12<<rom(d63) jmp_sub(SETUP);
WAIT:       while_not_sync(WAIT);

'BEGIN MAIN PROGRAM
MEM_SET:    ram_bank_low load_pipe_reg<<ram(DQ5) jmp_sub(PREDICT);

'GET REAL PCMIN SAMPLE
PCM_IN:     load_12<<rom(d4096) load_11_s1<<ram(I);

'CHECK NEG STATUS FLAG FOR IF CONDITION
PRE_IF:load_11_s4<<rom(d65534) load_12<<ram(SE) load_x-pcminp>>a1
                        if_x_LT_pcminp_then_jmpt(ER_SIG);
```

```
PRE_ESL:       else load_pcminp>>a1;

'CALCULATE QUANTISED ERROR SIGNAL
ER_SIG:load_11_s4<<rom(d1) store_x+a1>>a1_ram_1(SIGN) if_x+a1_LT_0_then_jmpt(CK_IF);
       load_12<<rom(d1) store_a1>>ram_h(O_IM) goto(LMO);

'CHECK FOR CONDITION - N= Z= ZERO
CK_IF:         load_12<<rom(d1) store_0-a1>>a1_ram_h(O_IM);

LMO:           load_x+a1>>a1 load_12<<rom(d128);
                 load_12<<rom(d8) if_x-a1_LT_0_then_jmp(A2048);
                   load_12<<rom(d2) if_x-a1_LT_0_then_jmp(A32);
                     load_12<<rom(d1) if_x-a1_GE_0_then_jmp(ED1);

A4:                   load_12<<rom(d4);
                      load_12<<rom(d2) if_x-a1_GE_0_then_jmp(ED1);
A3:                   load_12<<rom(d3) goto(ED1);
A32:                load_12<<rom(d32);
                    load_12<<rom(d16) if_x-a1_LT_0_then_jmp(A64);
                      load_12<<rom(d4) if_x-a1_GE_0_then_jmp(ED1);
A5:                   load_12<<rom(d5) goto(ED1);
A64:                load_12<<rom(d64);
                    load_12<<rom(d6) if_x-a1_GE_0_then_jmp(ED1);
A7:                 load_12<<rom(d7);
ED1:           store_x>>a1_ram_h(TEMP1) load_12<<rom(d8);
               load_x-a1>>a2 load_12<<ram(O_IM);
               load_11_s4<<rom(a2);
               store_x>>ram_h(O_IM) load_12<<rambus load_11_s4<<rom(d1) goto(ED3);

A2048:         load_12<<rom(d2048);
                 load_12<<rom(d512) if_x-a1_LT_0_then_jmp(A4096);
                   load_12<<rom(d256) if_x-a1_LT_0_then_jmp(A1024);
                     load_12<<rom(d8) if_x-a1_GE_0_then_jmp(ED2);
A9:                  load_12<<rom(d9) goto(ED2);
A1024:             load_12<<rom(d1024);
                   load_12<<rom(d10) if_x-a1_GE_0_then_jmp(ED2);
A11:               load_12<<rom(d11) goto(ED2);
A4096:           load_12<<rom(d4096);
                 load_12<<rom(d12) if_x-a1_GE_0_then_jmp(ED2);
A13:             load_12<<rom(d13);
ED2:           store_x>>a1_ram_h(TEMP1) load_12<<rom(d13);
               load_x-a1>>a2 load_12<<ram(O_IM);
               load_11_s4<<rom(a2);
               store_128x>>ram_m(O_IM) load_12<<rambus load_11_s4<<rom(d1);

'CONTINUE MAIN PROGRAM
ED3:           load_12<<ram(TEMP1) load_x>>a1;
               load_12<<ram(YOVER4) load_11_s4<<rom(d65535) load_128x+a1>>a1;
               load_12<<rom(d502) load_11_s3<<ram(Z) load_x+a1>>a1;
               load_12<<rom(d605) if_x+a1_LT_0_then_jmp(ME1);
               load_12<<rom(d656) if_x+a1_LT_0_then_jmp(ME2);
               load_12<<rom(d7) load_11_s1<<ram(I) if_x+a1_GE_0_then_jmp(ADPCM);
ME3:           load_12<<rom(d6) load_11_s1<<ram(I) goto(ADPCM);
ME1:           load_12<<rom(d336);
               load_12<<rom(d434) if_x+a1_LT_0_then_jmp(ME4);
               load_12<<rom(d3) load_11_s1<<ram(I) if_x+a1_GE_0_then_jmp(ADPCM);
ME5:           load_12<<rom(d2) load_11_s1<<ram(I) goto(ADPCM);
ME2:           load_12<<rom(d556);
               load_12<<rom(d5) load_11_s1<<ram(I) if_x+a1_GE_0_then_jmp(ADPCM);
ME6:           load_12<<rom(d4) load_11_s1<<ram(I) goto(ADPCM);
ME4:           load_12<<rom(d132);
               load_12<<rom(d1) load_11_s1<<ram(I) if_x+a1_GE_0_then_jmp(ADPCM);
ME7:           load_11_s4<<rom(d0);

ADPCM:load_x>>a1_a2 load_12<<ram(SIGN) load_11_s4<<rom(d1); 'N.B. a2 used at QNT1
```

```
'ADPCM DATA OUT - 4 BIT ENCODED DATA

'INVERSE QUANTISE TO PRODUCE EFFECTIVE INPUT/ DECODER OUTPUT
SUB_QAN:load_11_s4<<rom(d65535) load_12<<ram(I) load_x_eo_al>>al
                                                 if_x_eo_al=0_then_jmpt(SGN_CHN);

adpcm_out<<al load_11_s4<<rom(d1) goto(QNT1);
SGN_CHN:        store_x>>al_ram_h(SIGN) load_11_s4<<rom(d1) adpcm_out<<x;
QNT1:           store_a2>>ram_h(O_IM) load_12<<rom(d14) jmp_sub(quantize);

'UPDATE PREDICTOR - ADAPTIVE PREDICTOR
DATA_RX:        load_11_s4<<rom(d1) load_12<<ram(DQ) jmp_sub(update);

'######   ENCODE STAGE COMPLETE      #######

'######   START DECODING PROCEDURE   #######

'        START PROCEDURE PREDICT
SUB_PRD:        set_sync ram_bank_hgh load_pipe_reg<<ram(DQ5) jmp_sub(predict);

'GET QUANTISED ERROR SIGNAL - GET ADPCM INPUT SIGNAL
                load_11_s4<<rom(d1) load_12<<rambus store_adpcminp>>ram_m(SIGN)
                                                 if_RX_MUTE_then_jmp(mem_hgh);

else store_x_eo_adpcminp>>ram_h(O_IM);

'INVERSE QUANTISE TO PRODUCE DECODER OUTPUT
SUB_QNT:        load_11_s1<<ram(I) load_12<<rom(d14) jmp_sub(QUANTIZE);

'OUTPUT DEQUANTISED PREDICTOR PLUS ERROR

'CHECK FOR IF CONDITION - ZERO
QNT_IF1:        load_11_s1<<ram(I) load_12<<rom(d4095) if_al_LT_0_then_jmp(QNT_TH);

QNT_ES1:        load_x-al>>a2 if_x-al_GE_0_then_jmpt(PCM_OUT1);
QNT_THN:        store_x>>al_ram_h(SR) goto(PCM_OUT1);

QNT_TH:         load_x+al>>a2 if_x+al_LT_0_then_jmpt(QNT_TH1);
                load_11_s1<<ram(I) load_12<<rom(d4096) goto(pcm_out3);

QNT_TH1:        load_11_s1<<ram(I) load_12<<rom(d4096) load_x>>al;
                store_0-al>>al_ram_h(SR) goto(PCM_OUT3);

'GENERATE PCM OUTPUT SIGNAL
'UPDATE PREDICTOR
PCM_OUT1:       output_pcm_out<<al load_11_s4<<rom(d1) load_12<<ram(DQ) jmp_sub(UPDATE);
                goto(WAIT);
PCM_OUT3:       output_pcm_out<<x-al load_11_s4<<rom(d1) load_12<<ram(DQ) jmp_sub(UPDATE);
SYNC_RE:        goto(WAIT);
'#############   END OF MAIN PROGRAM   ################

'PROCEDURE INITIALISATION
SETUP:          load_11_s4<<rom(d1);
                load_x>>al load_12<<rom(d11);
                load_11_s4<<rom(d2);
                load_x>>a2 load_12<<rom(d65535);
                load_11_s4<<rom(d1);
LP:             store_0>>ram{al};
                load_x+al>>al;
                load_x+a2>>a2;
                if_a2_GT_0_then_jmp(LP);
                store_x>>ram_h(Z) load_12<<rom(d1);
                store_x>>al_ram_h(I) load_12<<rom(d32);
                store_x>>ram_h(R32) load_12<<rom(d1024);
                store_x>>al_ram_h(SDQ6);
```

```
                store_a1>>ram_h(SDQ5);
                store_a1>>ram_h(SDQ4);
                store_a1>>ram_h(SDQ3);
                store_a1>>ram_h(SDQ2);
                store_a1>>ram_h(R1024);
                store_a1>>ram_h(SDQ1)  load_12<<rom(d544);
                store_x>>a1_ram_h(YU);
                store_a1>>ram_h(YLH)   load_12<<rom(d512);
                store_x>>a1_ram_h(PK0);
                store_a1>>ram_h(PK1) return;
'END OF PROCEDURE INITIALISATION
'****************************************************************
'PROCEDURE PREDICT - ENCODE/ DECODE
'procedure 16 x 15 multiplication PREDICT:        load_12<<ram(__)  load_11_s2<<pipe_reg;

'procedure 16 x 15a multiplication
ENC_PRED:       load_pipe_reg<<ram(DQ4) load_11_s1<<pipe_reg load_128x>>a1;
                load_12<<ram(B5) load_11_s2<<pipe_reg load_x+a1>>a1;

'procedure 16 x 15a multiplication
                load_pipe_reg<<ram(DQ3) load_11_s1<<pipe_reg load_128x+a1>>a1;
                load_12<<ram(B4) load_11_s2<<pipe_reg load_x+a1>>a1;

'procedure 16 x 15a multiplication
                load_pipe_reg<<ram(DQ2) load_11_s1<<pipe_reg load_128x+a1>>a1;
                load_12<<ram(B3) load_11_s2<<pipe_reg load_x+a1>>a1;

'procedure 16 x 15a multiplication
                load_pipe_reg<<ram(DQ1) load_11_s1<<pipe_reg load_128x+a1>>a1;
                load_12<<ram(B2) load_11_s2<<pipe_reg load_x+a1>>a1;

'procedure 16 x 15a multiplication
                load_pipe_reg<<ram(DQ) load_11_s1<<pipe_reg load_128x+a1>>a1;
                load_12<<ram(B1) load_11_s2<<pipe_reg load_x+a1>>a1;
                load_pipe_reg<<ram(SR1) load_11_s1<<pipe_reg load_128x+a1>>a1;

store_x+a1>>a1_ram_1(SEZ);

'SIGNAL ESTIMATE
'procedure 16 x 15a multiplication
                load_12<<ram(A2) load_11_s2<<pipe_reg;

'procedure 16 x 15a multiplication
                load_pipe_reg<<ram(SR) load_11_s1<<pipe_reg load_128x+a1>>a1;
                load_12<<ram(A1) load_11_s2<<pipe_reg load_x+a1>>a1;
                load_11_s1<<pipe_reg load_128x+a1>>a1;
                store_x+a1>>a1_ram_1(SE);

load_11_s4<<rom(d1)  load_12<<ram(DQ4);
                store_x>>ram_h(DQ5);

load_12<<ram(DQ3);
                store_x>>ram_h(DQ4);

load_12<<ram(DQ2);
                store_x>>ram_h(DQ3);

load_12<<ram(DQ1);
                store_x>>ram_h(DQ2);

load_12<<ram(DQ);
                store_x>>ram_h(DQ1);
```

```
                    load_12<<ram(SR);
                    store_x>>ram_h(SR1);
```

'LIMIT SPEED CONTROL, FORM LINEAR COMBINATION OF FAST AND SLOW SCALE FACTORS
'BELOW ROUTINE EFFECTIVELY DOES IF APP<<256

'IF/ THEN  CONDITION - CHECK FOR ZERO FLAG
```
PR_IF:              load_11_s3<<ram(APP) load_12<<rom(d1) load_0>>a2;
                    load_11_s3<<ram(Z) load_12<<rom(d64) if_x=a2_then_jmp(AN_TH);
AN_ES:              load_12<<ram(YU) load_11_s4<<rom(d1);
                    store_x>>ram_h(Y) load_12<<rambus load_11_s4<<rom(d8) goto(PR_ES);
AN_TH:              load_128x>>a1 load_12<<ram(APP) load_11_s4<<rom(d16);
                    store_128x_and_a1>>ram_m(AL) load_11_s1<<rambus;
                    load_12<<ram(YLH);
                    load_32x>>a1 load_12<<ram(YU);
                    load_32x-a1>>a1 load_12<<ram(YLH) load_11_s4<<rom(d32);
                    store_128x+a1..ram_m(Y) load_12<<rambus load_11_s4<<rom(d8);
PR_ES:              store_128x>>a1_ram_m(YOVER4) return;
```
'END OF SUB-ROUTINE PREDICT - ENCODE/ DECODE 'PROCEDURE QUANTIZER - ENCODE/ DECODE
```
QUANTIZE:           load_11_s4<<rom(d3) load_12<<ram(O_IM) load_x>>a1;
                    store_x+a1>>a2_ram_h(TEMP4) load_11_s4<<rom(d32);
                    load_12<<rom(a2);
                    load_12<<ram(YOVER4) load_x>>a1;
                    store_x+a1>>a1_ram_m(TEMP1) load_12<<rambus load_11_s4<<rom(d1);
                    load_x>>a2 load_12<<rom(d4095) if_x_LT_0_then_jmpt(QN_IF1);
                    load_x_and_a1>>a1 load_12<<rom(d4096);
                    store_x+a1>>ram_h(TEMP1) load_12<<rom(a2) load_11_s2<<rambus;
                    load_11_s1<<ram(TEMP1) load_128x>>a1;
                    store_x+a1>>a1_ram_m(DQ) load_11_s4<<rom(d1) goto(QN_IF2);

QN_IF1:             store_0>>a1_ram(DQ);
```

'CHECK IF CONDITION - NEGATIVE
```
QN_IF2:             load_12<<ram(SIGN);
                    load_12<<rom(d1024) if_x_LT_0_then_jmp(QN_TH1);

QN_ES:              store_x>>ram_h(O_SDQ) goto(ADP_C1);

QN_TH1:             load_11_s4<<rom(d65535) load_12<<ram(DQ);
                    store_x>>ram_h(DQ) load_12<<rom(d1024) goto(QN_ES);
```

'QUANTIZER SCALE FACTOR ADAPTATION
```
ADP_C1:             load_11_s4<<rom(d1) load_12<<ram(TEMP4);
                    load_12<<rom(d1) load_x>>a2;
                    load_11_s4<<rom(d124) load_12<<ram(Y) load_x+a2>>a2;
                    load_11_s1<<ram(R32) load_12<<rom(a2) load_32x>>a1;
ADA_IF:             load_12<<rom(d544) store_128x+a1>>a1_ram_m(YU);
                    load_11_s4<<rom(d65504);
```
'CHECK FOR IF CONDITION - ZERO
```
                    load_128x+a1>>a2 load_11_s4<<rom(d32) if_128x_LT_a1_then_jmpt(ADA_THN);
```

'CHECK FOR IF CONDITION - NEGATIVE
```
ADA_ES:             load_12<<rom(d5120);
                    load_128x-a1>>a2 if_128x_LT_a1_then_jmpt(ADA_THN);
                    load_11_s4<<rom(d126) load_12<<ram(YLH) goto(ADA_CN1);
ADA_THN:            store_128x>>ram_m(YU) goto(ADA_CN);
```

'NOTE THE ABOVE COMPARE CONDITION HAS BEEN CHANGED TO ' > ' FROM
' '<' IN THE PASCAL PROGRAM. THIS CHANGE WAS DUE TO 'IF/THEN' CONDITION

```
ADA_CN:             load_11_s4<<rom(d126) load_12<<ram(YLH);
ADA_CN1:            load_11_s4<<rom(d63) load_12<<ram(YLL) load_32x>>a1;
```

```
              load_11_s4<<rom(d64) load_12<<ram(YU) load_x+a1>>a1;
              load_11_s4<<rom(d1) store_x+a1>>a1_ram_m(YLH);
              load_12<<rom(d4095);
              load_11_s4<<rom(d64) load_12<<rambus store_x_and_a1>>ram_h(TEMP1);
              store_x>>a1_ram_m(YLL);

'ADAPTATION SPEED CONTROL
ADAPT_ST:     load_11_s4<<rom(d1) load_12<<ram(TEMP4);
              load_12<<rom(d2) load_x>>a1;
              load_x+a1>>a1 load_11_s1<<ram(DMS) load_12<<rom(d3968);
              load_x>>a2 load_11_s2<<ram(DMS);
              load_128x+a2>>a2 load_11_s1<<ram(R32) load_12<<rom(a1);
              store_128x+a2>>ram_m(DMS) load_12<<rom(d4064);
              load_11_s1<<ram(DML);
              load_x>>a2 load_11_s2<<ram(DML);
              load_128x+a2>>a2 load_11_s1<<ram(R32) load_12<<rom(a1);
              store_128x+a2>>ram_m(DML) load_12<<rom(d3840);

load_11_s1<<    .(APP);
              load_x>>a2 load_11_s2<<ram(APP);
              store_128x+a2>>ram_m(APP);
'SPEED CONTROL PARAMETER
              load_11_s4<<rom(d8) load_12<<ram(DML);
              load_x>>a1 load_11_s4<<rom(d32) load_12<<ram(DMS);
              load_11_s4<<rom(d1) load_12<<ram(DML) load_x-a1>>a1
                                                   if_x_GE_a1_then_jmpt(ABS1);

ABS:          load_0-a1>>a1;
ABS1:         load_x-a1>>a1 load_11_s4<<rom(d1) load_12<<ram(APP);
              if_a1_LE_0_then_jmp(CNTL_ES);
OR_1:         load_12<<rom(d1536);
              load_12<<ram(Y) load_x>>a1;
              load_12<<ram(APP) if_x_LT_a1_then_jmp(CNTL_ES);
OR_2:         load_12<<rom(d53760);
              load_12<<ram(A2) load_x>>a1;
              load_12<<ram(APP) if_x-a1_GE_0_then_jmp(SCP_END);

CNTL_ES:      load_12<<rom(d32) load_x>>a1;
              store_x+a1>>ram_h(APP);
SCP_END:      load_11_s4<<rom(d2) load_12<<ram(SE);
              load_11_s4<<rom(d1) load_12<<ram(DQ) load_x>>a1;
              store_x+a1>>a1_ram_h(SR) return;
'END OF ROUTINE QUANTIZER - ENCODE 'PROCEDURE UPDATE - ENCODE
UPDATE:       load_11_s4<<rom(d1) load_12<<ram(O_SDQ) if_x=0_then_jmp(CHE_TH);

store_x>>ram_h(TEMP1) goto(UPDAT);

CHE_TH:       store_0>>ram(TEMP1);

UPDAT:        load_11_s4<<rom(d16) load_12<<ram(B6);

'CHANGED UPDATE MACRO:- BN = TEMP1(34) , BEFORE IT WAS O_SDQ(42)
              load_11_s4<<rom(d32) load_x>>a1 load_pipe_reg<<ram(TEMP1);
              load_12<<ram(SDQ6) load_128x-a1>>a1 load_11_s3<<pipe_reg;
              store_128x+a1>>a1_ram_m(B6);

UP_DAT2:      load_11_s4<<rom(d16) load_12<<ram(B5);
              load_11_s4<<rom(d32) load_x>>a1;
              load_12<<ram(SDQ5) load_128x-a1>>a1 load_11_s4<<rom(d1);
              store_x>>ram_h(SDQ6) load_11_s3<<pipe_reg load_12<<rambus;
              store_128x+a1>>a1_ram_m(B5);
```

```
UP_DAT3:       load_l1_s4<<rom(d16) load_l2<<ram(B4);
               load_l1_s4<<rom(d32) load_x>>a1;
               load_l2<<ram(SDQ4) load_128x-a1>>a1 load_l1_s4<<rom(d1);
               store_x>>ram_h(SDQ5) load_l1_s3<<pipe_reg load_l2<<rambus;
               store_128x+a1>>a1_ram_m(B4);

UP_DAT4:       load_l1_s4<<rom(d16) load_l2<<ram(B3);
               load_l1_s4<<rom(d32) load_x>>a1;
               load_l2<<ram(SDQ3) load_128x-a1>>a1 load_l1_s4<<rom(d1);
               store_x>>ram_h(SDQ4) load_l1_s3<<pipe_reg load_l2<<rambus;
               store_128x+a1>>a1_ram_m(B3);

UP_DAT5:       load_l1_s4<<rom(d16) load_l2<<ram(B2);
               load_l1_s4<<rom(d32) load_x>>a1;
               load_l2<<ram(SDQ2) load_128x-a1>>a1 load_l1_s4<<rom(d1);
               store_x>>ram_h(SDQ3) load_l1_s3<<pipe_reg load_l2<<rambus;
               store_128x+a1>>a1_ram_m(B2);

UP_DAT6:       load_l1_s4<<rom(d16) load_l2<<ram(B1);
               load_l1_s4<<rom(d32) load_x>>a1;
               load_l2<<ram(SDQ1) load_128x-a1>>a1 load_l1_s4<<rom(d1);
               store_x>>ram_h(SDQ2) load_l1_s3<<pipe_reg load_l2<<rambus;
               store_128x+a1>>a1_ram_m(B1);

UP_CON1:       load_l1_s4<<rom(d1) load_l2<<ram(O_SDQ);
               store_x>>a1_ram_h(SDQ1);
UP_CON2:       load_l2<<ram(PK1);
               store_x>>a1_ram_h(O_SDQ);
UP_CON3:       load_l2<<ram(PK0);
               store_x>>a1_ram_h(PK1) load_l1_s4<<rom(d1);

load_l1_s4<<rom(d2) load_l2<<ram(SEZ);
UP_IF1:        load_l1_s4<<rom(d1) load_l2<<ram(DQ) load_x>>a1;

'CHECK FOR IF CONDITION - NEGATIVE

'OLD CODE DELETED - 'new code ADDED
               load_l2<<rom(d512) load_l1_s3<<ram(Z) load_x+a1>>a1
                                                 if_x+a1_LT_0_then_jmpt(UP_TH);
               load_l1_s4<<rom(d1);
UP_TH:         store_x>>a2_ram_h(PK0) load_l2<<rambus load_l1_s4<<rom(d1);

store_a1>>ram_h(TEMP2) load_l2<<rambus if_a1=0_then_jmpt(UP_CN);
               store_a2>>ram_h(TEMP2) load_l2<<rambus;

'END OF 'new code - CONTINUATION OF OLD CODE PLUS MINOR ADDITION

UP_CN:         load_l1_s3<<ram(PK1);
UP_CN1:        store_x>>a1_a2_ram_h(TEMP1) if_x=0_then_jmpt(UD_TH);

'CHECK FOR IF CONDITION - NEGATIVE
UD_IF:   load_l1_s4<<rom(d1) load_l2<<ram(A1) if_a1_GE_0_then_jmp(UD_TH);
         load_l1_s4<<rom(d65535);
UD_TH:   load_x>>a2 load_l1_s1<<ram(I) load_l2<<rom(d8192) if_x_GE_0_then_jmpt(UT_ES);

'CHECK FOR IF CONDITION - NEGATIVE
UT_TH:         load_l1_s4<<rom(d65535) if_x+a2_LT_0_then_jmp(UA_TH);
               load_l1_s4<<rom(d16) load_l2<<ram(A1) goto(UP_CAN);

UT_ES:         load_l1_s4<<rom(d1) if_x-a2_GE_0_then_jmp(UP_CON);
UA_TH:         load_x>>a2;
UP_CON:        load_l1_s4<<rom(d16) load_l2<<ram(A1);
UP_CAN:        load_l1_s4<<rom(d32) load_l2<<ram(A1) load_x>>a1;
               load_l1_s4<<rom(d6) load_l2<<ram(TEMP1) load_128x-a1>>a1;
```

```
                store_128x+a1>>a1_ram_m(A1);
                load_l1_s4<<rom(d4) load_l2<<rambus store_a2>>ram_h(TEMP4);
                load_l1_s4<<rom(d127) load_l2<<ram(A2) load_32x>>a1;
                load_l1_s2<<ram(O_PK2) load_32x-a1>>a1;
                load_l2<<ram(TEMP2);
                load_128x+a1>>a1;

'LIMIT A2
'CHECK FOR IF CONDITION - NEGATIVE

ST_IF:          load_128x+a1>>a1_a2 load_l1_s1<<ram(R32) load_l2<<rom(d12288)
                                                if_128x_LT_0_then_jmpt(ST_TH);

' ^ N.B. a2 used to load RAM and l2 later
ST_ES:          load_l2<<rom(d3) if_128x_LT_a1_then_jmp(LI_A2);
                load_l1_s4<<rom(d1) store_a2>>ram_m(A2) load_l2<<rambus goto(SP_CON1);
LI_A2:          store_128x>>ram_h(A2) load_l1_s4<<rom(d1) load_l2<<rambus goto(SP_CON1);

ST_TH:          load_l2<<rom(d3) if_128x+a1_LT_0_then_jmp(ST_THA);
                load_l1_s4<<rom(d1) store_a2>>ram_m(A2) load_l2<<rambus goto(SP_CON1);

ST_THA:         load_128x>>a_.
                store_0-a1>>ram_h(A2) load_l1_s4<<rom(d1) load_l2<<rambus;

'LIMIT A1
SP_CON1:        load_l2<<rom(d120) load_x>>a1;
                load_l1_s4<<rom(d1) load_l2<<ram(A1) load_128x-a1>>a1;

'CHECK FOR IF CONDITION - NEGATIVE
SR_IF:          load_l1_s4<<rom(d65535) if_x_LT_0_then_jmp(SR_TH);

SR_ES:          if_x+a1_GE_0_then_jmp(TRAN);

SV_ES:          store_a1>>ram_h(A1) goto(TRAN);

SR_TH:          if_x+a1_GE_0_then_jmp(TRAN);
SU_CMP:         store_0-a1>>ram_h(A1);

TRAN:           load_l2<<ram(A2) load_l1_s4<<rom(d1);
                load_x>>a1 load_l2<<rom(d11776);
                load_l1_s4<<rom(d8) load_l2<<ram(YLH) load_x+a1>>a1
                                                if_x+a1_LT_0_then_jmpt(TRAN_TH);

else return;

TRAN_TH:        store_x>>ram_m(YN);
                load_128x>>a1 load_l1_s1<<ram(I) load_l2<<rom(d3840);
                load_l1_s4<<rom(d1) store_128x_and_a1>>a1_ram_l(YX);
                load_l2<<ram(YN);
                load_l2<<rom(d8) load_x>>a1;
                load_l2<<rom(d38) if_x-a1_LT_0_then_jmp(TRAN_1);
                load_x>>a1 load_l2<<ram(YX);
                load_x+a1>>a1;
                load_l2<<rom(a1);
                store_x>>ram_h(TEMP1);
                load_l2<<ram(YN);
                load_x>>a2 load_l2<<ram(DQ) load_l1_s4<<rom(d8) goto(TRAN_ELS);

TRAN_1:         load_l1_s4<<rom(d31) load_l2<<ram(R1024);
                load_x>>a2 load_l2<<ram(DQ) load_l1_s4<<rom(d8);

TRAN_ELS:       load_x>>a1 load_l1_s1<<ram(TEMP1) load_l2<<rom(a2);
                if_a1_LE_0_then_jmp(DO_N1);
DO_N:           load_0-a1>>a1;
DO_N1:          load_x+a1>>a1;
```

```
                load_x+a1>>a1;
                load_x+a1>>a1 if_x_LT_0_then_jmpt(TRN_TH2);
                else return;
TRN_TH2:        store_0>>ram(A1);
                store_0>>ram(A2);
                store_0>>ram(B1);
                store_0>>ram(B2);
                store_0>>ram(B3);
                store_0>>ram(B4);
                store_0>>ram(B5) load_11_s4<<rom(d1);
                store_0>>ram(B6) load_12<<rom(d256);
QNT_END:        store_x>>ram_h(APP) return;

'END OF ROUTINE ADAPT - PREDICTOR UPDATE
'***********************************************************************
'*                                                                     *
'*      THE   REMAINING  CODE   IS   USED   FOR   DEVICE TEST PURPOSES *
'*                                                                     *
'***********************************************************************
'
'CODEC INTERFACE TEST ROUTINE
'
                load_12<<rom(..) load_11_s1<<ram(I);
                store_x>>a2_ram_h(YN) load_11_s1<<rambus pcm_out;
                load_11_s4<<rom(d63) if_x=pcminp_then_jmp(CODC1);
                goto(ERROR);
CODC1:          load_11_s4<<rom(d8192) load_x>>a1;
                store_x+a1>>ram_h(YN) load_11_s1<<rambus pcm_out;
                load_12<<rom(a2) if_x=pcminp_then_jmp(CODC2);
                goto(ERROR);
CODC2:          load_11_s4<<rom(d32);
                load_11_s4<<rom(d1) load_x>>a1;
                store_x+a1>>ram_h(YN) load_12<<rambus pcm_out;
                load_11_s4<<rom(d63) if_x=pcminp_then_jmp(CODC3);
                goto(ERROR);
CODC3:          load_12<<rom(a2);
                store_x>>ram_h(YN) load_11_s4<<rom(d1) pcm_out;
                load_11_s4<<rom(d1) load_12<<ram(I) if_x=pcminp_then_jmp(CODC4);
                goto(ERROR);
CODC4:          load_11_s4<<rom(d7) load_x+a2>>a2;
                if_x=a2_then_jmp(CODC5);
                load_12<<rom(a2) goto(CODC2);
CODC5:          output_pcm_out<<x;
ERROR:          goto(MEM_LOW);
'
'PARAMETER ROM TEST ROUTINE
'ADD ROM CONTENTS
'
ROM_TS:         load_11_s4<<rom(d1);
                load_12<<rom(d95) load_0>>a2;
                load_x>>a1;
DAT_JP:         load_12<<rom(a1);
                load_x+a2>>a2 load_12<<rom(d65535);
                load_x+a1>>a1 if_x+a1_LT_0_then_jmpt(MEM_LOW);
END:            goto(DAT_JP);
'
'PARAMETER RAM TEST ROUTINE
'
'WRITE ZEROES
'
RAM_TS:         load_11_s4<<rom(d1);
                load_12<<rom(d79);
                load_x>>a1 load_12<<rom(d65535);
CON1:           store_0>>ram(a1);
                load_x+a1>>a1 if_x+a1_GE_0_then_jmpt(CON1);
```

```
'READ ZEROES AND WRITE ONES
'
NEXT_1:         load_12<<rom(d79);
                load_x>>a1;
CON2:           load_12<<ram{a1} load_0>>a2;
                if_x=a2_then_jmp(PROC_1) load_12<<rom(d65535);
                goto(BAD_1);
PROC_1:         store_x>>ram{a1};           ' Change in Sfg1 : l1 = 1, l2 = -1
                load_x+a1>>a1 if_x+a1_GE_0_then_jmpt(CON2);
'
'READ ONES TWICE AND WRITE ZEROES
'
NEXT_2:         load_12<<rom(d79);
                load_x>>a1 load_12<<rom(d65535);
CON3:           load_x>>a2 load_12<<ram{a1};  ' Change in Sfg1 : l1 = 1, l2 = -1
                if_x=a2_then_jmp(PROC_R) load_12<<rom(d65535);
                goto(BAD_1);
PROC_R:         load_x+a1>>a1 load_12<<rom(d79) if_x+a1_LT_0_then_jmpt(READA);
                goto(CON3) load_12<<rom(d65535);
READA:          load_x>>a1 load_12<<rom(d65535);
CONR:           load_x>>a2 load_12<<ram{a1};  ' Change in Sfg1 : l1 = 1, l2 = -1
                if_x=a2_then_jmp(PROC_2);
                goto(BAD_1);
PROC_2:         store_0>>ram{a1};
                load_x+a1>>a1 if_x+a1_LT_0_then_jmpt(CONR);

'READ ZEROES WRITE ONE-ZEROES
'

NEXT_3:         load_12<<rom(d79);
                load_x>>a1;
CON4:           load_12<<ram{a1} load_0>>a2;
                load_12<<rom(d21845) if_x=a2_then_jmp(PROC_3);
                goto(BAD_1);
PROC_3:         store_x>>ram{a1};
                load_12<<rom(d65535);
                load_x+a1>>a1 if_x+a1_GE_0_then_jmpt(CON4);
'
'READ ONE-ZEROES - END OF TEST
'

NEXT_4:         load_12<<rom(d79);
                load_x>>a1 load_12<<rom(d21845);
                load_x>>a2;
CON5:           load_12<<ram{a1};
                load_12<<rom(d65535) if_x=a2_then_jmp(PROC_4);
                goto(BAD_1);
PROC_4:         load_x+a1>>a1 if_x+a1_GE_0_then_jmpt(MEM_LOW);

'!!!! Unnecessary - removed GOOD_1:      goto(MEM_LOW);

'
'WAIT LOOP FOR FAILED TEST
'

BAD_1:          load_l1_s4<<rom(d1);
                load_12<<rom(d204);
                load_x>>a2 load_12<<rom(d65535);
LOOP:           load_x+a2>>a2 if_x+a2_LT_0_then_jmpt(MEM_LOW);
                goto(LOOP);
BAD:            goto(MEM_LOW);
```

We claim:

1. A digital signal processor incorporated in an integrated circuit and including first and second sources of binary numbers, a parallel binary multiplier having a first input port with a first plurality of conductors for receiving in parallel a first plurality of bits defining a first number, a second input port with a second plurality of conductors for receiving in parallel a second plurality of bits defining a second number, and an output port with a third plurality of conductors for transmitting in parallel a third plurality of bits representing the product of the first and second numbers, the first plurality being substantially larger than the second plurality, a first data selector connected from the first and second sources to the first input port of the multiplier, a second data selector connected from the first and second sources to the second input port of the multiplier, and means for controlling the operation of the first and second data selectors according to the number of bits in the binary numbers from the first and second sources.

2. A processor according to claim 1, wherein the first data selector is connected to the first and second sources of binary numbers for enabling the selection by said first data selector of at least two different pluralities of bits from the first source or the second source of binary numbers.

3. A processor according to claim 1, wherein the second data selector is connected to the first and second sources of binary numbers for enabling the selection by said second data selector of at least two different pluralities of bits from the first source or the second source of binary numbers.

4. A processor according to claim 1, wherein at least one of the first and second data selectors includes latch means for storing input data for later output.

5. A processor according to claim 1, further including a third data selector, a data bus having a plurality of conductors, said third data selector being connected between the output port of the multiplier and the data bus and being enabled to ship the bits representing the product output by the multiplier as received from the output port of the multiplier relative to the conductors of the data bus.

6. A processor according to claim 1, wherein the first and second sources of binary numbers are a random-access memory and a read-only memory respectively.

7. A processor according to claim 6, further including a register connected between the first source and the second data selector, the register having a number of stages corresponding to the number of conductors in the first plurality of conductors.

8. A processor according to claim 7, wherein the register has more than one mode of operation, and in one mode of operation the inputs of the register are applied directly to the outputs of the register and the stages of the register do not store the data conveyed from the inputs to the outputs.

9. A processor according to claim 1, further including a parallel adding/subtracting means having an input port and an output port, the input port of said adding/subtracting means being connected to the output port of the multiplier.

10. A processor according to claim 9, wherein said adding/subtracting means has a second input port, and including a further data selector connected to the second input port of the adding/subtracting means to apply data to the adding/subtracting means.

11. A processor according to claim 10, wherein the output port of the adding/subtracting means is connected to the first source of binary numbers.

12. A processor according to claim 11, including an input port for data to be processed connected to the further data selector and an output port for processed data connected to the output port of the adding/subtracting means.

13. A processor according to claim 1, arranged to convert an ADPCM encoded signal into a PCM signal and to convert a PCM signal into an ADPCM encoded signal.

* * * * *